(12) United States Patent
Lo et al.

(10) Patent No.: US 11,631,464 B2
(45) Date of Patent: Apr. 18, 2023

(54) MEMORY APPARATUS AND ASSOCIATED CONTROL METHOD FOR REDUCING ERASE DISTURB OF NON-VOLATILE MEMORY

(71) Applicant: MACRONIX INTERNATIONAL CO., LTD., Hsinchu (TW)

(72) Inventors: Su-Chueh Lo, Hsinchu (TW); Kuen-Long Chang, Taipei (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 14 days.

(21) Appl. No.: 17/178,313

(22) Filed: Feb. 18, 2021

(65) Prior Publication Data

US 2021/0366557 A1 Nov. 25, 2021

Related U.S. Application Data

(60) Provisional application No. 63/027,969, filed on May 21, 2020.

(51) Int. Cl.
| | |
|---|---|
| G11C 16/16 | (2006.01) |
| G11C 16/30 | (2006.01) |
| G11C 16/34 | (2006.01) |
| G11C 16/26 | (2006.01) |

(52) U.S. Cl.
CPC .............. G11C 16/16 (2013.01); G11C 16/26 (2013.01); G11C 16/30 (2013.01); G11C 16/3409 (2013.01)

(58) Field of Classification Search
CPC ..... G11C 16/16; G11C 16/26; G11C 16/3409; G11C 16/3468
See application file for complete search history.

(56) References Cited

U.S. PATENT DOCUMENTS

| | | | |
|---|---|---|---|
| 6,094,373 | A | 7/2000 | Saito |
| 6,468,874 | B1 | 10/2002 | Yu et al. |
| 6,842,378 | B2 | 1/2005 | Chang |
| 7,701,741 | B2 | 4/2010 | Yip |

(Continued)

FOREIGN PATENT DOCUMENTS

| | | |
|---|---|---|
| CN | 101266836 A | 9/2008 |
| CN | 103390426 B | 11/2013 |
| TW | 462106 B | 11/2001 |

*Primary Examiner* — Alfredo Bermudez Lozada
(74) *Attorney, Agent, or Firm* — McClure, Qualey & Rodack, LLP

(57) ABSTRACT

A memory apparatus and a control method are provided. The memory apparatus includes a non-volatile memory array having plural memory groups, and the control method is applied to the non-volatile memory array. The memory groups jointly share a first well, and the control method is applied to the non-volatile memory array. A first memory group among the memory groups is erased according to a first erase command after the memory apparatus is power-on, and a first amount of the memory groups are recovered in a first erase-recover procedure after the first memory group is erased. A second memory group among the memory groups is erased according to a second erase command after the first erase-recover procedure, and a second amount of the memory groups are recovered in a second erase-recover procedure after the second memory group is erased. The first amount is greater than the second amount.

15 Claims, 18 Drawing Sheets

(56) References Cited

U.S. PATENT DOCUMENTS

| | | |
|---|---|---|
| 8,982,640 B2 | 3/2015 | Hung |
| 9,245,644 B2 | 1/2016 | Hung |
| 2008/0285368 A1 | 11/2008 | Hung et al. |
| 2013/0250675 A1* | 9/2013 | Hung .................. G11C 16/3418 365/185.02 |
| 2014/0063947 A1 | 3/2014 | Ghodsi |
| 2014/0307504 A1* | 10/2014 | Hung ..................... G11C 16/34 438/257 |

* cited by examiner

MEMORY APPARATUS AND ASSOCIATED CONTROL METHOD FOR REDUCING ERASE DISTURB OF NON-VOLATILE MEMORY

This application claims the benefit of U.S. provisional application Ser. No. 63/027,969, filed May 21, 2020, the disclosure of which is incorporated by reference herein in its entirety.

TECHNICAL FIELD

The disclosure relates in general to a memory apparatus and a control method, and more particularly to a memory apparatus and a control method capable of reducing erase disturb of non-volatile memory.

BACKGROUND

FIG. 1 (prior art) is a schematic diagram illustrating the construction of a non-volatile memory array. The non-volatile memory array 11 includes multiple erase groups 11a, 11b, and each of the erase groups 11a, 11b includes multiple memory groups (MG) 101. The memory group (MG) 101 can be a group of memory cells such as a segment, block, or sector.

As the memory groups (MG) 101 in the same erase group 11a jointly share a well (P-well or N-well), erase disturb might occur in the erase group 11a. That is, when one of the memory groups 101 is selected for erase, the memory groups 101 in the same erase group 11a, which are not selected for erase, are disturbed by the erase operation.

FIG. 2 (prior art) is a schematic diagram illustrating how characteristic of the memory cell changes in response to the erase operation and recovery operation. In the read operation, a read voltage Vr is applied to the memory cell, and the cell current $I_{cell}$ (drain current) corresponding to the memory cell is measured to determine the state of the memory cell.

If the measured result shows that the cell current $I_{cell}$ is higher than the reference current Iref, the memory cell is determined to be at the erase state (for example, curve L1). Thus, the memory cell, having the characteristic as the curve L1 shows, is at the erase state. The cell gate voltage Vg corresponding to the curve L1 is represented as an erase verify voltage Ve.

If the cell current $I_{cell}$ is lower than the reference current Iref, the memory cell is determined to be programmed (for example, curve L2). Thus, the memory cell, having the characteristic as the curve L2 shows, is at the program state. The cell gate voltage Vg corresponding to the curve L2 is represented as a program verify voltage Vp.

When any of the memory groups receives an erase bias voltage, the memory groups sharing the same well with the erased memory group are disturbed, and such a phenomenon is defined as erase disturb. In short, erase disturb refers to the effect of memory groups undergoing a degree of erase despite not being selected for erase. The erase disturb might result in that threshold voltages of the memory cells in the memory groups not selected for erase are changed.

For example, the characteristics of the memory cells might change from curve L2 to the curve L3. The cell gate voltage Vg corresponding to the curve L3 is represented as a read voltage Vr. Consequentially, the control circuitry of the memory apparatus can barely identify the state of the memory cell because the measured cell current is very close to the reference current Iref. In other words, the data stored at the memory cells being disturbed cannot be correctly acquired.

To prevent the data stored at the memory cells from being affected, the recovery operation, including recovery verification and recovery program, is proposed in a conventional approach such as U.S. Pat. No. 8,982,640. However, based on the conventional approach, the memory cells in some of the memory groups might still be affected by the erase disturb as there is a chance that the memory groups remain unselected for recovery in consecutive cycles.

SUMMARY

The disclosure is directed to a memory apparatus and a control method capable of dynamically selecting memory groups for recovery and reducing erase disturb of non-volatile memory.

According to one embodiment, a memory apparatus is provided. The memory apparatus includes a non-volatile memory array. The non-volatile memory array includes a first erase group, and the first erase group includes a plurality of memory groups jointly sharing a first well. A first memory group among the memory groups is erased according to a first erase command after the memory apparatus is power-on, and a first amount of the memory groups are recovered in a first erase-recover procedure after the first memory group is erased. A second memory group among the memory groups is erased according to a second erase command after the first erase-recover procedure, and a second amount of the memory groups are recovered in a second erase-recover procedure after the second memory group is erased. The first amount is greater than the second amount.

According to another embodiment, a control method applied to a non-volatile memory array having a plurality of erase groups is provided. A first erase group among the plurality of erase groups includes a plurality of memory groups, and the plurality of memory groups jointly share a first well. The control method includes following steps. Firstly, a first memory group among the memory groups is erased according to a first erase command after the memory apparatus is power-on. Then, a first amount of the memory groups is recovered in a first erase-recover procedure after the first memory group is erased. A second memory group among the memory groups is erased according to a second erase command after the first erase-recover procedure. A second amount of the memory groups is recovered in a second erase-recover procedure after the second memory group is erased. The first amount is greater than the second amount.

Figure 1:
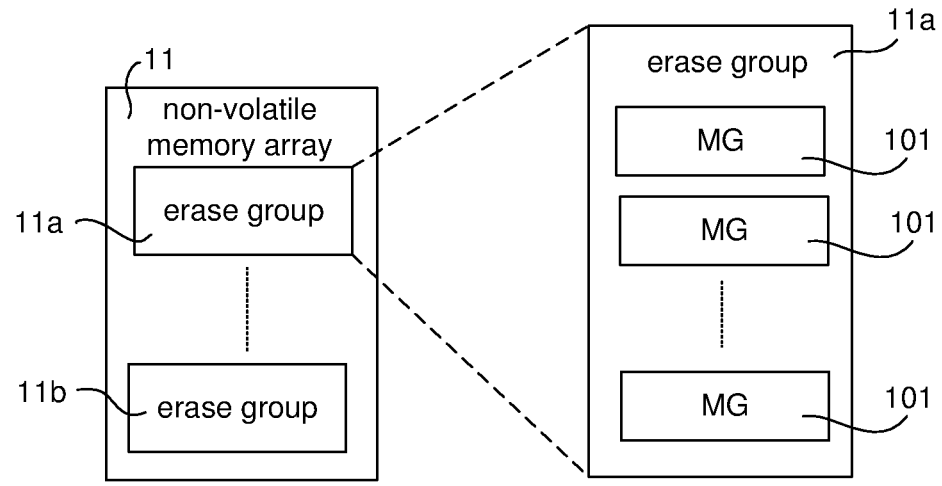
FIG. 1 (prior art) is a schematic diagram illustrating the construction of a non-volatile memory array.
Figure 2:
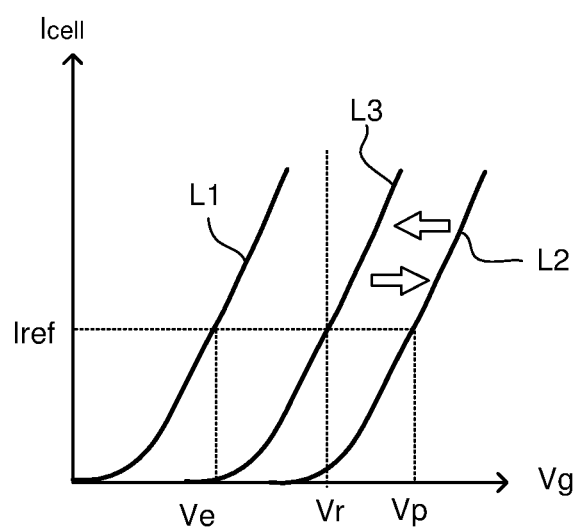
FIG. 2 (prior art) is a schematic diagram illustrating how characteristic of the memory cell changes in response to the erase operation and recovery operation.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 3:
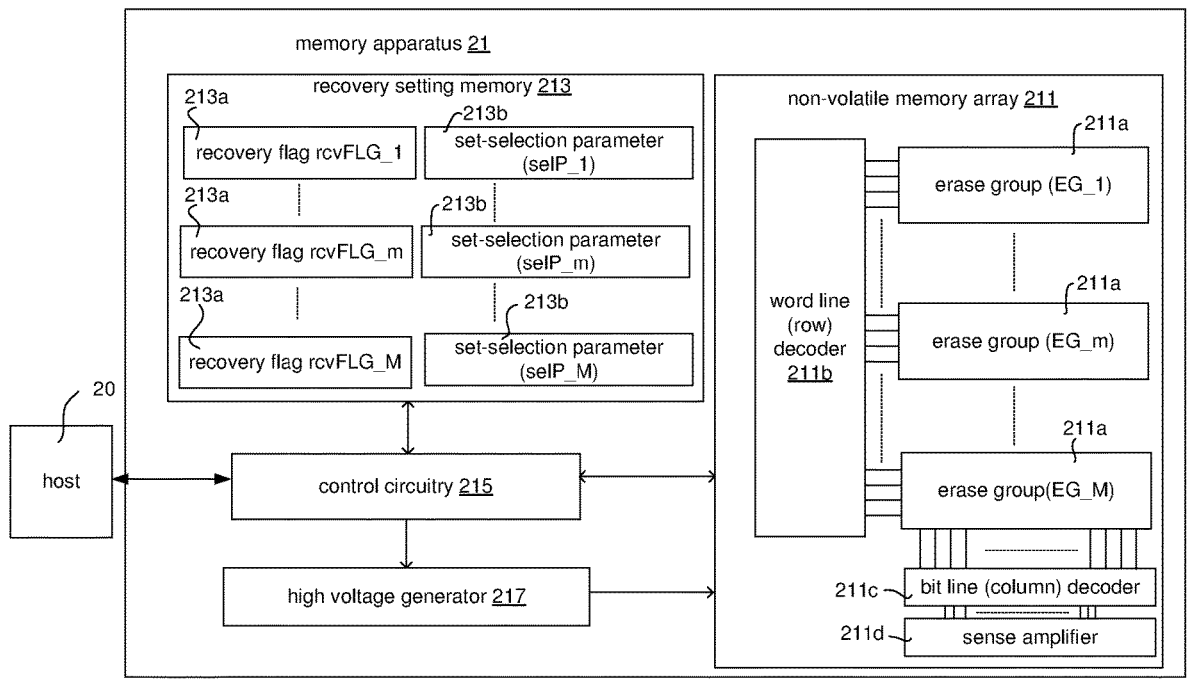
FIG. 3 is a block diagram illustrating a memory apparatus according to an embodiment of the present disclosure.

FIG. 3 is a block diagram illustrating a memory apparatus according to an embodiment of the present disclosure. The memory apparatus 21 includes a non-volatile memory array 211, a recovery setting memory 213, a control circuitry 215, and a high voltage generator 217. The non-volatile memory array 211 includes M erase groups (EG_1-EG_M) 211a, a word line (or row) decoder 211b, a bit line (or column) decoder 211c, and a sense amplifier 211d. Each of the M erase groups (EG_1-EG_M) 211a includes N memory groups. The word line decoder 211b is coupled to, and in electrical communication with, a plurality of word lines, and arranged along rows in the non-volatile memory array 211. The bit line decoder 211c is coupled to and in electrical communication with a plurality of bit lines arranged along with columns in the non-volatile memory array 211.

The control circuitry 215 is coupled to the host 20 and the components in the non-volatile memory array 211, such as the word line decoder 211b, the bit line decoder 211c, the sense amplifier 211d, and so forth. The control circuitry 215 receives read commands, write (program) commands, and erase commands from the host 20. The sense amplifier 211d is coupled to the bit line decoder 211c. The high voltage generator 217 is coupled to the control circuitry 215 and the non-volatile memory array 211. The control circuitry 215 selectively controls the high voltage generator 217 to provide the read bias voltages, the erase bias voltages, the program bias voltages, and the recover bias voltages to the memory cells in the erase groups (EG_1-EG_M) 211a, depending on the commands issued by the host 20.

The recovery setting memory 213 is coupled to the control circuitry 215, and the recovery setting memory 213 includes two parts. The first part is used for saving M recovery flags (rcvFLG_1-rcvFLG_M), and the second part is used for saving M set-selection parameters (seIP_1-seIP_M). In short, the first part is utilized to represent whether any of the N memory groups in the m-th erase group (EG_m) (wherein m=1-M) has been selected for erase after the power-on of the memory apparatus 21. Moreover, the second part is utilized to select which of the N memory groups in the m-th erase group (EG_m) (wherein m=1-M) should be selected for the recovery operation. In practical application, the recovery operation may include the recovery verify and the recovery program. Details about the implementation and flow of the recovery operation are not described in the specification.

The M recovery flags (rcvFLG_1-rcvFLG_M) are respectively corresponding to the M erase groups (EG_1-EG_M) 211a. The M recovery flags (rcvFLG_1-rcvFLG_M) are initialized as "0" soon after the memory apparatus 21 is power-on. When any of the N memory groups in one of the m-th erase group (EG_m) 211a is selected for erase, the recovery flag corresponding to the m-th erase group (EG_m) 211a is set to "1".

The M set-selection parameters (seIP_1-seIP_M) are respectively corresponding to the M erase groups (EG_1-EG_M) 211a. The M set-selection parameters (seIP_1-seIP_M) are initialized soon after the memory apparatus 21 is power-on. The initialized value can be a predefined value, for example, "1" or a randomly generated number. The initialized values for the set-selection parameters (seIP_1-seIP_M) can be identical or different.

In practical application, the host 20 determines which memory groups in which erase group (EG_1-EG_M) 211a should be erased. For example, assuming that each of the M erase groups (EG_1-EG_M) 211a includes N=12 memory groups (MG1-MG12), and an exemplary sequence of five consecutive erase commands received after the memory apparatus 21 is power-on is listed in Table 1.

TABLE 1

| order of erase command | memory group MG being selected for erase | erase times corresponding to erase groups (V) |
|---|---|---|
| 1 | memory group MG1 in first erase group (EG_1) | V__1 = 1<br>V__m = 0<br>V__M = 0 |
| 2 | memory group MG3 in M-th erase group (EG_M) | V__1 = 1<br>V__m = 0<br>V__M = 1 |
| 3 | memory group MG10 in first erase group (EG_1) | V__1 = 2<br>V__m = 0<br>V__M = 1 |
| 4 | memory group MG8 in m-th erase group (EG_m) | V__1 = 2<br>V__m = 1<br>V__M = 1 |
| 5 | memory group MG2 in M-th erase group (EG_M) | V__1 = 2<br>V__m = 1<br>V__M = 2 |

The first row of Table 1 is illustrated as an example. When the first erase command is received after the memory apparatus 21 is power-on, the memory group MG10 in the first erase group (EG_1) is selected for erase. Then, the erase times (V_1) corresponding to the first erase group (EG_1) is equivalent to 1 (V_1=1), the erase times (V_m) corresponding to the m-th erase group (EG_m) is equivalent to 0 (V_m=0), and the erase times (V_M) corresponding to the M-th erase group is equivalent to 0 (V_M=0). Descriptions about the fields of the rest of the other rows in Table 1 are omitted to avoid redundancy. In the following descriptions, only the erase-recover procedures corresponding to the m-th erase group (EG_m) are concerned.

Table 1 shows that the numbers of erase times being performed to separate erase groups are respectively counted. Whereas, in the specification, the number of the erase times mentioned in the specification represents that the memory group(s) in the same erase group (for example, the m-th erase group EG_m) being selected for erase operation. Alternatively speaking, only the erase commands which are performed to the m-th erase group EG_m are concerned.

In the specification, the erase-recover procedure includes an erase operation and a recovery operation. The erase operation is related to the memory group being selected for erase. The recovery operation is related to some of the memory groups sharing the same well with the n-th memory group during the erase-recover procedure. Please notice that the present disclosure mainly concerns which of the memory groups are selected/unselected for recover, and details about implementing the recovery operation are omitted.

For the sake of illustration, it is assumed that the m-th erase group EG_m includes N=12 memory groups. Three embodiments are illustrated below. A certain exemplary sequence of the memory groups being selected for erase is repetitively used in these embodiments. However, the sequence of selecting memory groups for erase should not be limited. In these embodiments, the amounts of memory groups being selected for recovery in the second and subsequent erase-recover procedures are lower than the amount of memory groups being selected for recovery in the first erase-recover procedure.

In this specification, the memory groups are shown with different styles of rectangles. The regular rectangles represent the common memory groups, which can be empty or programmed. The rectangles with diagonal stripe represent the n-th memory group undergoing erase (wherein n might vary in different erase-recover procedures). The rectangles with dotted screentone represent the memory groups being recovered. The rectangles with bold edges represent the memory groups that just finish the erase operation.

Figure 4A:
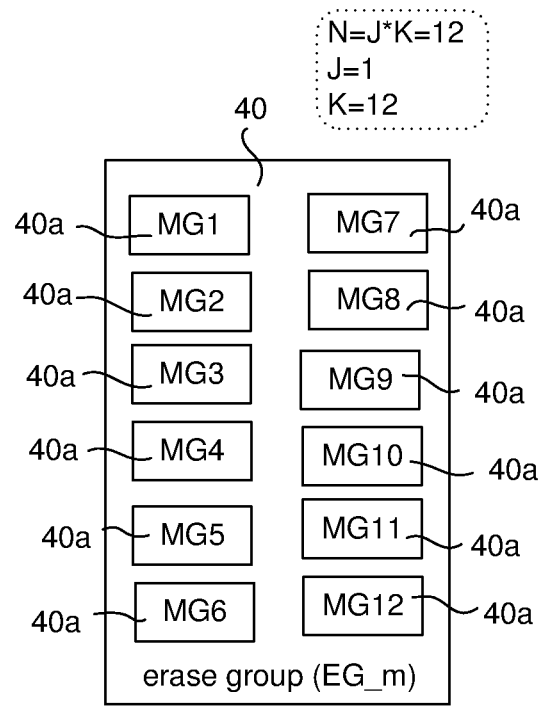
FIG. 4A is a schematic diagram illustrating an exemplary erase group having 12 memory groups.

FIGS. 4A, 4B, 5A, 5B, and 6A-6F are corresponding to the first embodiment of the present disclosure. For the sake of illustration, in the following figures, only the m-th erase group (EG_m) being selected for ease is drawn, and the components such as memory apparatus, control circuitry, and high voltage generator are not repetitively drawn. Whereas, the control mechanism and operations of the following embodiment are based on those described in FIG. 3. FIG. 4A is a schematic diagram illustrating an exemplary erase group having 12 memory groups. In FIG. 4A, the m-th erase group (EG_m) includes N=12 memory groups 40a (MG1-MG12).

Figure 4B:
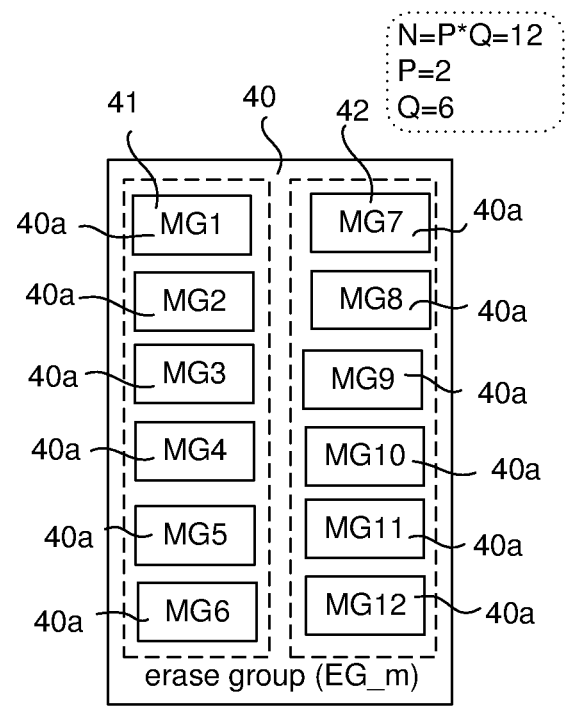
FIG. 4B is a schematic diagram illustrating how the memory groups in the m-th erase group are allocated for the recovery operation in the erase-recover procedures other than the first erase-recover procedure.

FIG. 4B is a schematic diagram illustrating how the memory groups in the m-th erase group (EG_m) are allocated for the recovery operation in the erase-recover procedures other than the first erase-recover procedure. In the first embodiment, memory groups (MG1-MG12) 40a in the m-th erase group (EG_m) 40 are classified into two (P=2) alternate selection sets 41, 42, and each of the alternate selection sets 41, 42 includes six memory groups (Q=6). The alternate selection set 41 includes memory groups MG1-MG6, and the alternate selection set 42 includes memory groups MG7-MG12.

In the specification, the memory groups in separate alternate selection sets 41, 42 are alternatively recovered. In other words, the number of erase times of the m-th erase group (EG_m) 40 dominates which of the N memory groups (MG1-MG12) 40a are selected for the recovery operation. The number of erase times (V_m) is an accumulated value, which represents that any of the N memory groups (MG1-MG12) 40a in the m-th erase group (EG_m) 40 is selected for erasing. For the sake of illustration, the following illustrations consider only the erase-recover procedures related to the m-th erase group (EG_m) 40.

Figure 5A:
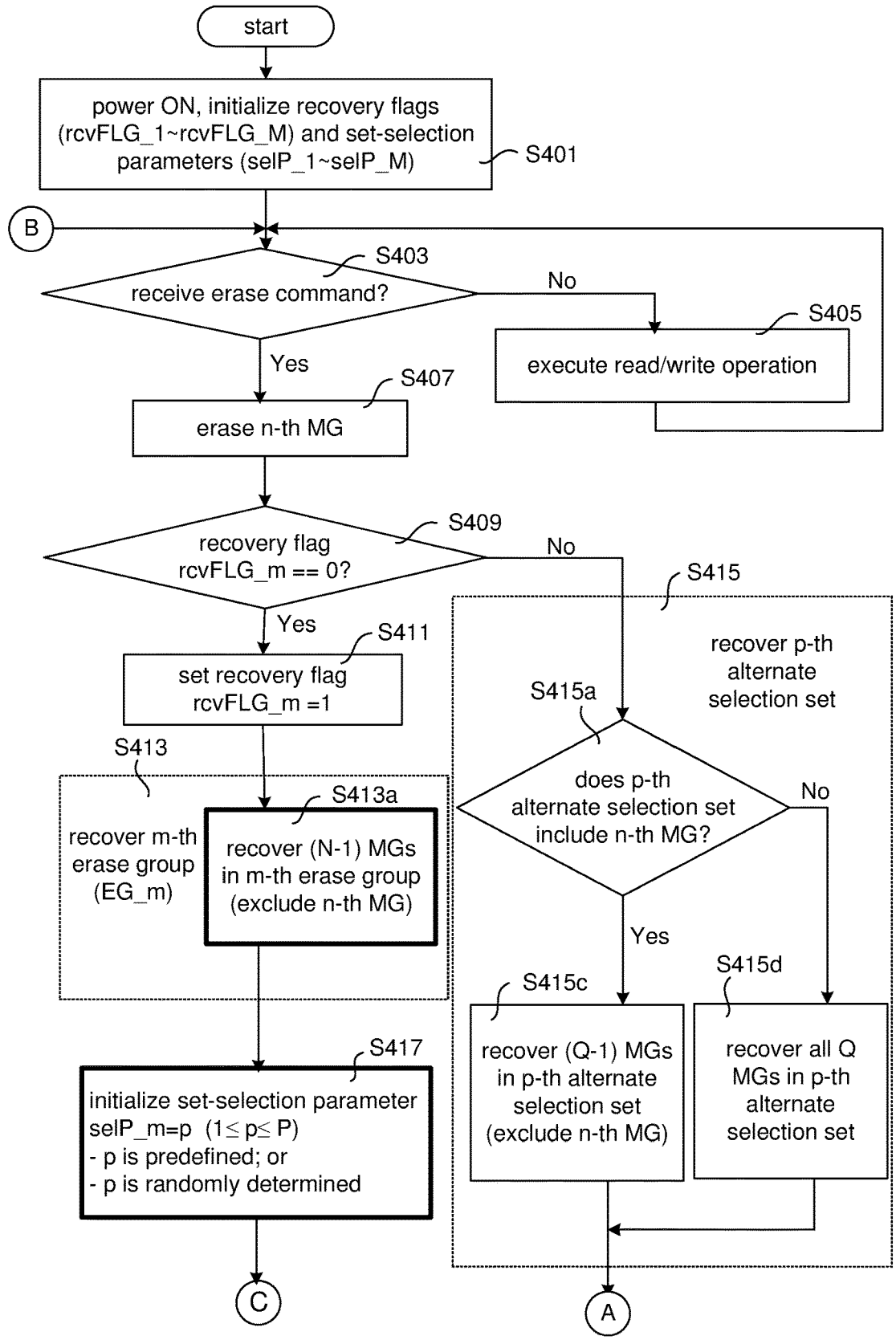
FIGS. 5A and 5B are a flow diagram illustrating the control flow according to the first embodiment of the present disclosure.
Figure 5B:
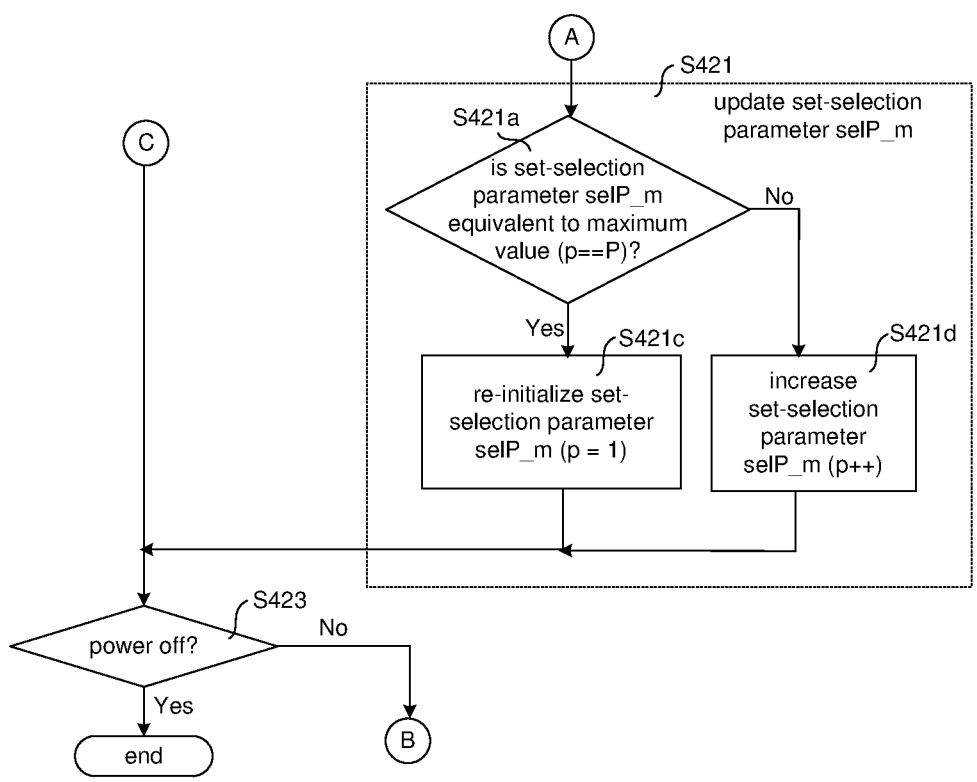

FIGS. 5A and 5B are a flow diagram illustrating the control flow according to the first embodiment of the present disclosure. After the memory apparatus is power-on, the M recovery flags (rcvFLG_1-rcvFLG_M) and the M set-selection parameters (seIP_1-seIP_M) are initialized (step S401). Then, the control circuitry determines whether the erase command is received (step S403). If not, the read/write operation is executed, depending on which command is sent from the host (step S405).

If the determination result of step S403 is positive, the control circuitry controls the high voltage generator to supply erase voltage to the n-th memory group (step S407). The control circuitry further determines whether the recovery flag (rcvFLG_m) corresponding to the m-th erase group (EG_m) 40 is equivalent to "0" (rcvFLG_m=0) (step S409).

If the determination result of step S409 is positive, the control circuitry sets the recovery flag (rcvFLG_m) corresponding to the m-th erase group (EG_m) 40 to "1" (rcvFLG_m=1) (step S411). Then, the m-th erase group (EG_m) 40 is recovered (step S413). In step S413, the control circuitry controls the high voltage generator to provide the recover bias voltages to (M−1) memory groups in the m-th erase group (EG_m) 40 (step S413a). That is, all the N memory groups 40a in the m-th erase group (EG_m) 40, except the n-th memory group actually undergoing erase, are recovered. After the n-th memory group undergoing the erase operation, the data stored at the n-th memory group can be valid but blank. Alternatively, in some occasions, there might not be valid data stored in the n-th memory group after the n-th memory group is erased. As the stored data might be blank or invalid, the n-th memory group is not compulsively necessary to be recovered. Whereas, in practical applications, the n-th memory group might be recovered as well. That is, all N memory groups (MG) 40a in the m-th erase group (EG_m) 40, including the n-th memory group, are all recovered in step S413a. After step S413 ends, the control circuitry initializes the set-selection parameter seIP_m by predefined or randomly determined (step S417). The value of the set-selection parameter setIP_m is represented as "p", wherein p is a positive integer between 1 and P ($1 \leq p \leq P$).

On the other hand, if the determination result of step S409 is negative, the p-th alternate selection set is recovered (step S415). Step S415 further includes the following steps. Firstly, the control circuitry determines whether the p-th alternate selection set includes the n-th memory group undergoing erase (step S415a). If the n-th memory group does not belong to the p-th alternate selection set, all Q memory groups in the p-th alternate selection set are recovered (step S415d). If the n-th memory group belongs to the p-th alternate selection set, the memory groups in the p-th alternate selection set except the n-th memory group are recovered (step S415c). That is, it is assumed that (Q−1) memory groups in the p-th alternate selection set are recovered in step S415c. Whereas, in practical applications, it is also possible to recover all the Q memory groups, including the n-th memory group, in the p-th alternate selection set in step S415c.

After the step S415 completes, the value of the set-selection parameter seIP_m is updated (step S421). The control circuitry determines whether the set-selection parameter seIP_m is equivalent to the maximum value P (step S421a). If the determination result of step S421a is positive, the set-selection parameter seIP_m is re-initialized (p=1) (step S421c). If the determination result of step S421a is negative, the set-selection parameter seIP_m is increased by 1 (p++) (step S421d).

Then, it is determined whether the memory apparatus 21 is power off (step S423). If the determination result of step S423 is positive, the flow ends. Otherwise, step S403 is repetitively performed. According to the flow diagram in FIGS. 5A, 5B, steps S411, S413, S417 are performed in the first erase-recover procedure after the memory apparatus is power-on. Relatively, steps S415, S421 are performed in the erase-recover procedures other than the first erase-recover procedure after the memory apparatus is power-on.

FIGS. 6A-6F are schematic diagrams illustrating states of memory groups MG1-MG12 in the selected erase group (EG_m) in different erase-recover procedures after the memory apparatus is power-on according to the first embodiment of the present disclosure. Each of the erase-recover procedures includes an erase operation and a recovery operation. The left parts of FIGS. 6A-6F represent states of the memory groups (MG1-MG12) in the m-th erase group (EG_m) 40 during the erase operation. The right parts of FIGS. 6A-6F represent states of the memory groups in the m-th erase group (EG_m) 40 during the recovery operation.

Figure 6A:
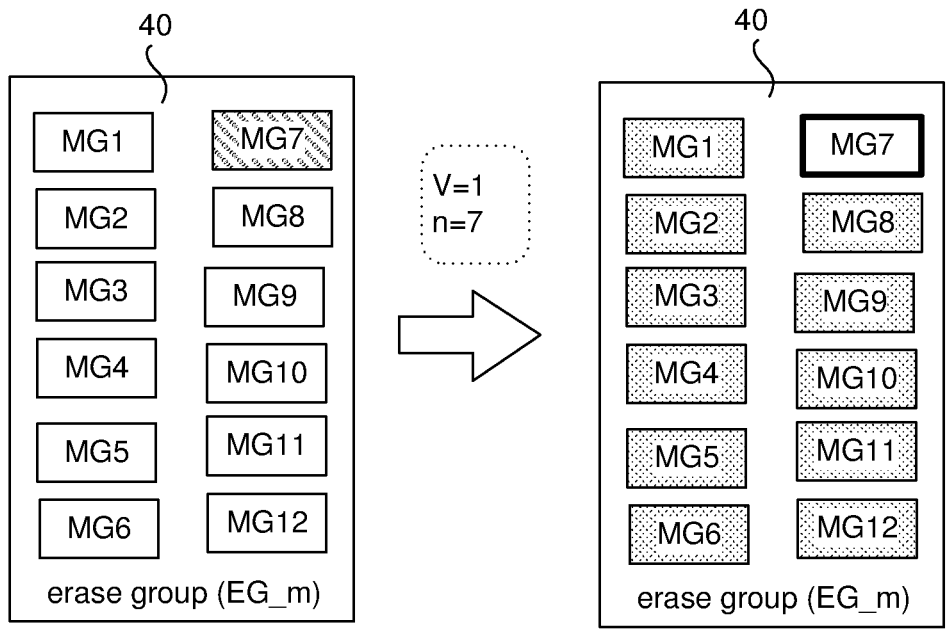
FIGS. 6A-6F are schematic diagrams illustrating states of memory groups MG1-MG12 in the selected erase group EG_m in different erase-recover procedures after the memory apparatus is power-on according to the first embodiment of the present disclosure.

Please refer to FIGS. 5A, 5B, and 6A together. FIG. 6A is corresponding to the $1^{st}$ erase-recover procedure (V=1) performed to the m-th erase group (EG_m) 40 after the memory apparatus is power-on. During the $1^{st}$ erase-recover procedure, the n-th memory group MG7 is erased (n=7, step S407), the recovery flag rcvFLG_m is determined to be equivalent to "0" (step S409), the recovery flag rcvFLG_M is set to "1" (step S411), and all the memory groups in the m-th erase group (EG_m) 40 except the n-th memory group MG7 are recovered (step S413). By the time the recovery operations being performed to the memory groups MG1-MG6, MG8-MG12 complete, the set-selection parameter seIP_m is initialized (step S417). The set-selection parameter seIP_m can be defined with a predefined value. Or, the set-selection parameter seIP_m can be assigned with a randomly generated value between 1 to P ($1 \leq p \leq P$). In the first embodiment, it is assumed that the set-selection parameter seIP_m is initialized with a predefined value "2" (p=2).

As mentioned in step S413a, it is possible to recover the memory groups in the m-th erase group (EG_m) 40, except the n-th memory group MG7, in the first erase-recover procedure after the memory apparatus is power-on. That is, the memory groups MG1-MG6, MG8-MG12 are recovered. Or, in some applications, it is possible that all the N=12 memory groups MG1-MG12 in the m-th erase group (EG_m) 40 are recovered, in the first erase-recover procedure after the memory apparatus is power-on.

Figure 6B:
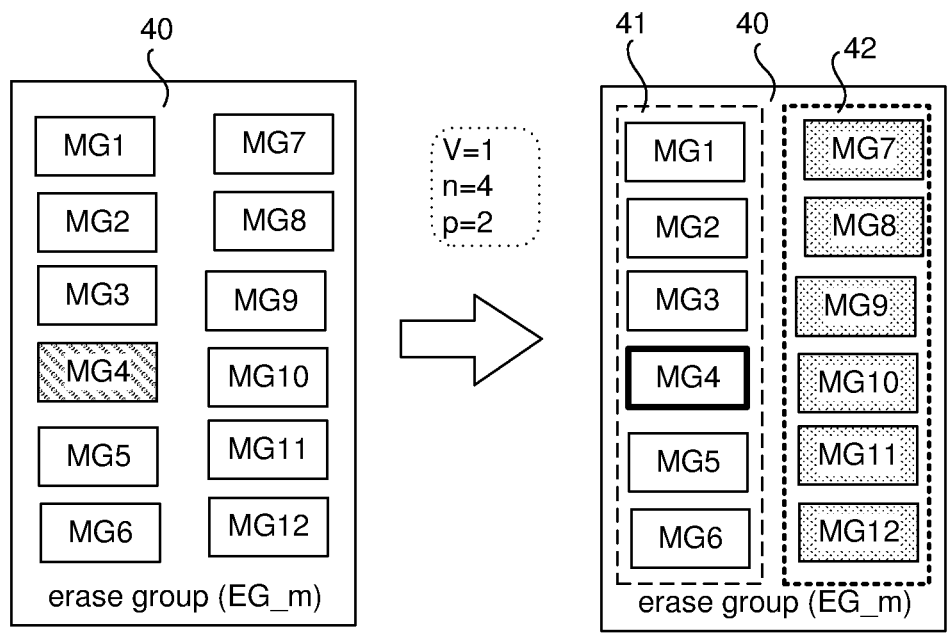

Please refer to FIGS. 5A, 5B, and 6B together. FIG. 6B is corresponding to the $2^{nd}$ erase-recover procedure (V=2) performed to the m-th erase group (EG_m) 40 after the memory apparatus is power-on. During the $2^{nd}$ erase-recover procedure, the n-th memory group MG4 is erased (n=4, step S407), the recovery flag rcvFLG_m is determined to be equivalent to "1" (step S409), and the recovery operation is performed to the memory groups in the p-th alternate selection set 42 (p=2) (step S415). Since the recovery flag rcvFLG_m is equivalent to "1", step S415 is performed. As the n-th memory group undergoing erase (that is, memory group MG4) is not part of the alternate selection set 42 (p=2), all the Q=6 memory groups in the alternate selection set 42 (p=2) (that is, memory groups MG7-MG12) should be recovered (the determination result of step S415a is negative, and step S415d is performed). By the time the recovery operations being performed to the memory groups MG7-MG12 in the alternate selection set 42 (p=2) complete, the set-selection parameter seIP_m is re-initialized (that is, the set-selection parameter seIP_m is changed from p=2 to p=1) (step S421c).

Figure 6C:
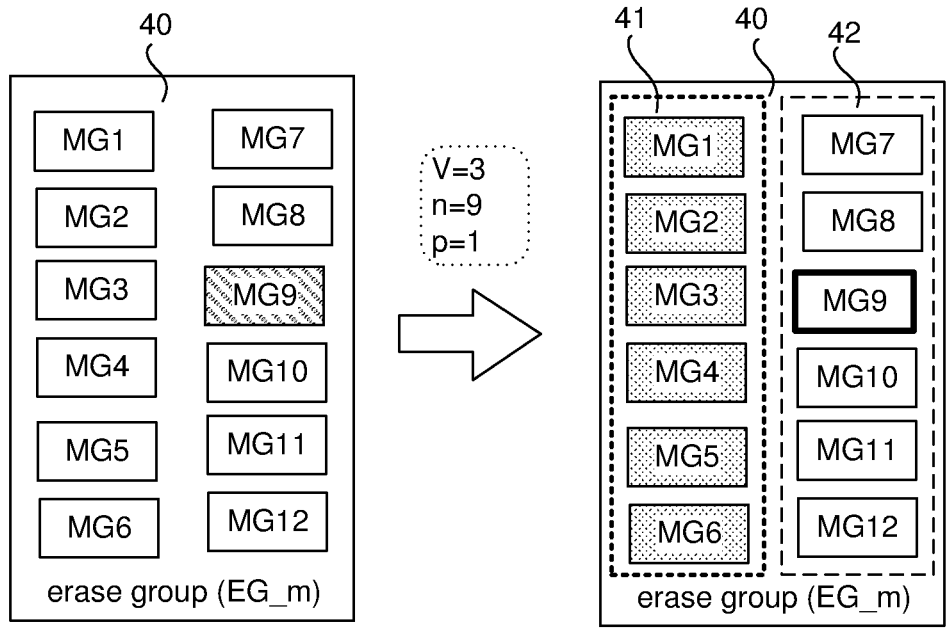

Please refer to FIGS. 5A, 5B, and 6C together. FIG. 6C is corresponding to the $3^{rd}$ erase-recover procedure (V=3) performed to the m-th erase group (EG_m) 40 after the memory apparatus is power-on. During the $3^{rd}$ erase-recover procedure, the n-th memory group MG9 is erased (n=9, step S407), the recovery flag rcvFLG_m is determined to be equivalent to "1" (step S409), and the recovery operation is performed to the memory groups in the alternate selection set 41 (p=1) (step S415). Since the recovery flag rcvFLG_m is equivalent to "1", step S415 is performed. As the n-th memory group undergoing erase (that is, memory group MG9) is not part of the alternate selection set 41 (p=1), all the Q=6 memory groups in the alternate selection set 41 (p=1) (that is, memory groups MG1-MG6) should be recovered (the determination result of step S415a is negative, and step S415d is performed). By the time the recovery operations being performed to the memory groups MG1-MG6 in the alternate selection set 41 (p=1) complete, the set-selection parameter seIP_m is increased by 1 (that is, the set-selection parameter seIP_m is changed from p=1 to p=2) (step S421d).

Figure 6D:
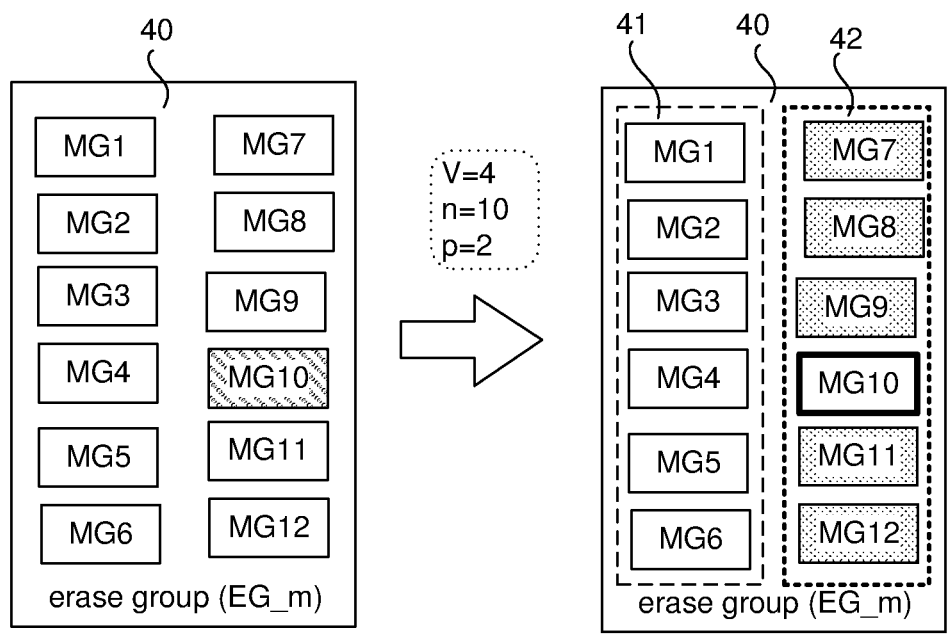

Please refer to FIGS. 5A, 5B, and 6D together. FIG. 6D is corresponding to the 4th erase-recover procedure (V=4) performed to the m-th erase group (EG_m) 40 after the memory apparatus is power-on. During the 4th erase-recover procedure, the n-th memory group MG10 is erased (n=10, step S407), the recovery flag rcvFLG_m is determined to be equivalent to "1" (step S409), and the recovery operation is performed to the memory groups in the alternate selection set 42 (p=2) (step S415). Since the recovery flag rcvFLG_m is equivalent to "1", step S415 is performed. As the n-th memory group undergoing erase (that is, memory group MG10) is part of the alternate selection set 42 (p=2), only (Q-1)=5 memory groups in the alternate selection set 42 (p=2) (that is, memory groups MG7-MG9, MG11, MG12) should be recovered (the determination result of step S415a is positive, and step S415c is performed). By the time the recovery operations being performed to the memory groups MG7-MG9, MG11, MG12 in the alternate selection set 42 (p=2) complete, the set-selection parameter seIP_m is re-initialized (that is, the value of the set-selection parameter seIP_m is changed from p=2 to p=1) (step S421c).

As mentioned in step S415c, depending on the application, it is possible to recover Q memory groups (that is, all the memory groups MG7-MG12 in the p-th alternate selection set 42 (p=2)), or recover (Q-1) memory groups (that is, the memory groups in the p-th alternate selection set 42 (p=2) except the n-th memory group (MG7).

Figure 6E:
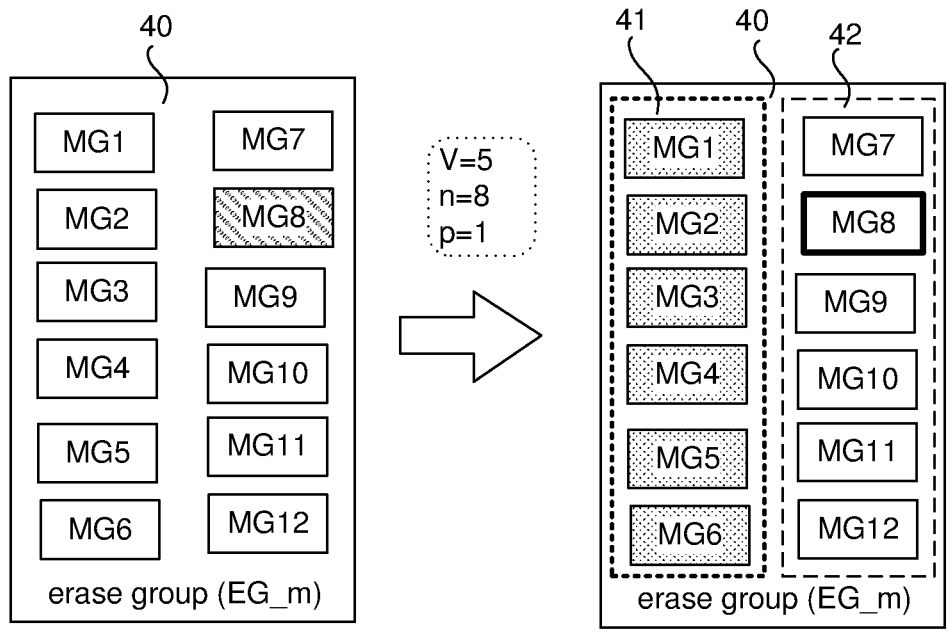

Please refer to FIGS. 5A, 5B, and 6E together. FIG. 6E is corresponding to the 5th erase-recover procedure (V=5) performed to the m-th erase group (EG_m) 40 after the memory apparatus is power-on. During the $5^{th}$ erase-recover procedure, the n-th memory group MG8 is erased (n=8, step S407), the recovery flag rcvFLG_m is determined to be equivalent to "1" (step S409), and the recovery operation is performed to the memory groups in the alternate selection set 41 (p=1) (step S415). Since the recovery flag rcvFLG_m is equivalent to "1", step S415 is performed. As the n-th memory group undergoing erase (that is, memory group MG8) is not part of the alternate selection set 41 (p=1), all the Q=6 memory groups in the alternate selection set 41 (p=1) (that is, memory groups MG1-MG6) should be recovered (the determination result of step S415a is negative, and step S415d is performed). By the time the recovery operations being performed to the memory groups MG1-MG6 in the alternate selection set (p=1) 41 complete, the set-selection parameter seIP_m is increased by 1 (that is, set-selection parameter seIP_m is changed from p=1 to p=2) (step S421d).

Figure 6F:
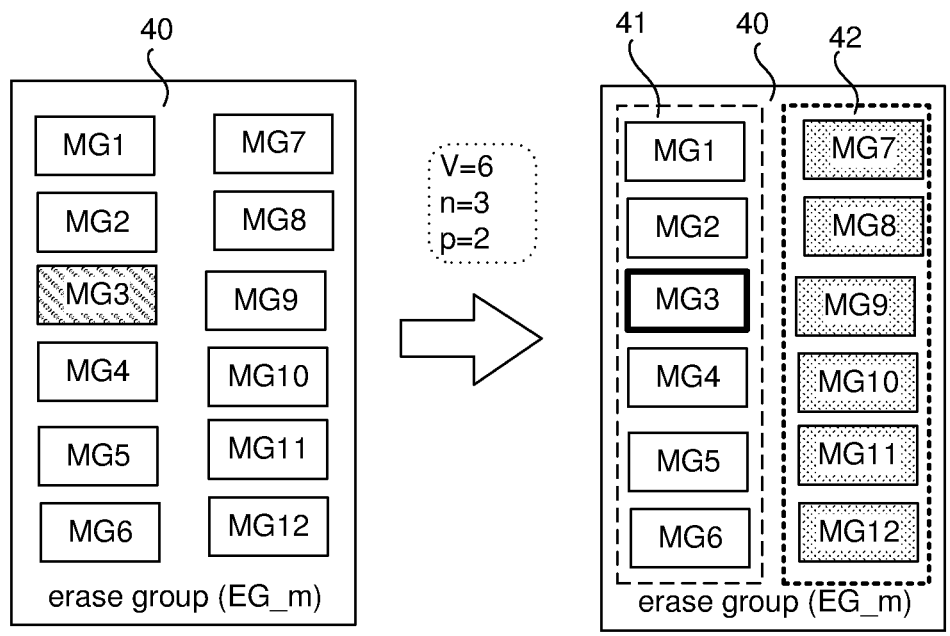

Please refer to FIGS. 5A, 5B, and 6F together. FIG. 6F is corresponding to the 6th erase-recover procedure (V=6) performed to the m-th erase group (EG_m) 40 after the memory apparatus is power-on. During the $6^{th}$ erase-recover procedure, the n-th memory group MG3 is erased (step S407), the recovery flag rcvFLG_m is determined to be equivalent to "1" (step S409), and the recovery operation is performed to the memory groups in the alternate selection set 42 (p=2) (step S415). Since the recovery flag rcvFLG_m is equivalent to "1", step S415 is performed. As the n-th memory group undergoing erase (that is, memory group MG3) is not part of the alternate selection set 42 (p=2), all Q=6 memory groups in the alternate selection set 42 (p=2) (that is, memory groups MG7-MG12) should be recovered (the determination result of step S415a is negative, and step S415d is performed).

The erase-recover procedures performed to the m-th erase group (EG_m) 40 based on the first embodiment according to the present disclosure are summarized in Table 2.

sets based on the second and the third embodiments of the present disclosure. The erase groups MG1-MG12 are classified into four alternate selection sets 61, 62, 63, 64 (P=4), and each of the alternate selection sets 61, 62, 63, 64 includes Q=N/P=3 (N=12, and P=4) memory groups. The alternate selection set 61 (p=1) includes memory groups MG1-MG3, the alternate selection set 62 (p=2) includes memory groups MG4-MG6, the alternate selection set 63 (p=3) includes memory groups MG7-MG9, and the alternate selection set 64 (p=4) includes memory groups MG10-MG12.

Figure 8A:
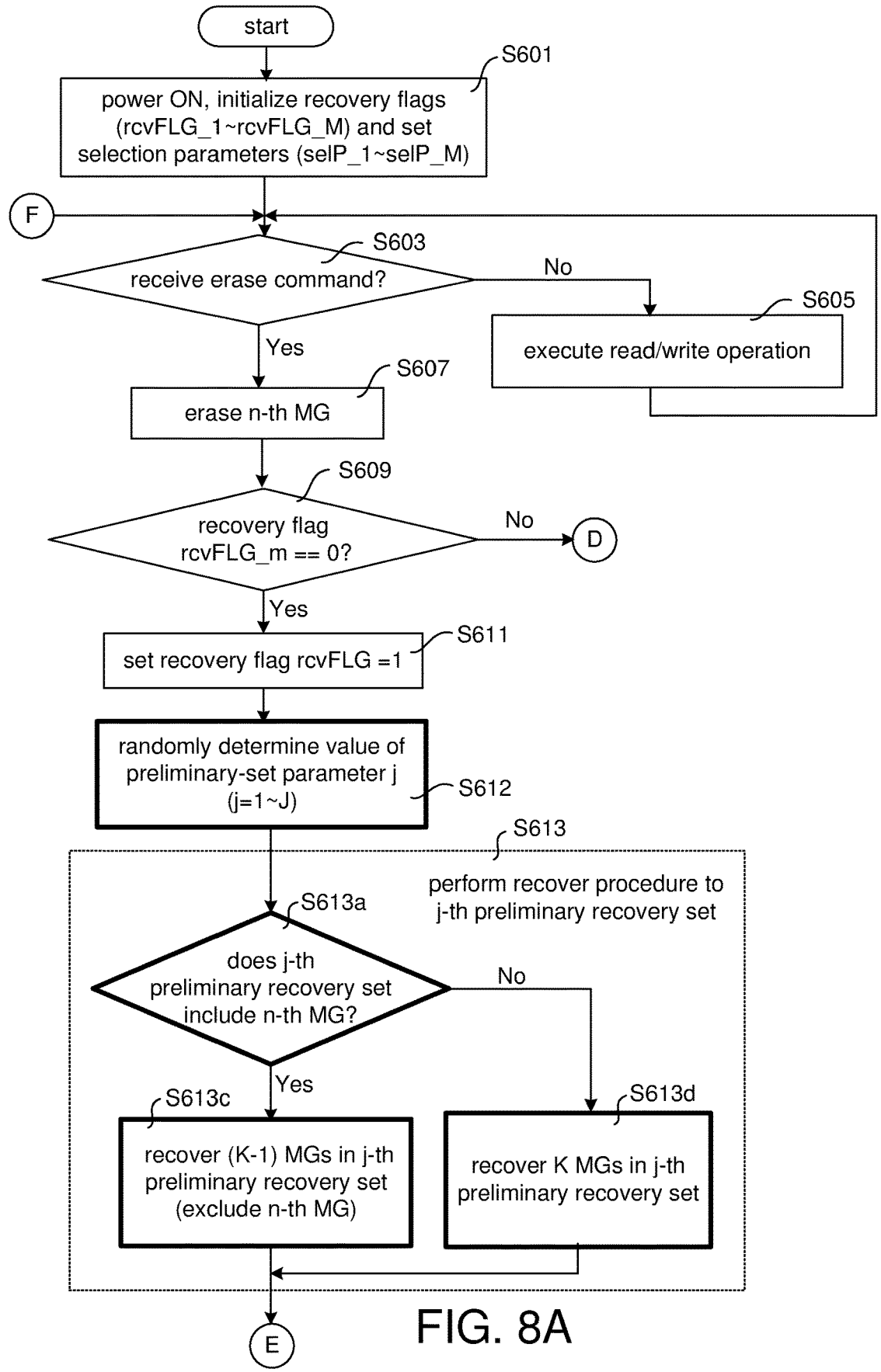
FIGS. 8A and 8B are a flow diagram illustrating the control flow according to the second and the third embodiments of the present disclosure.
Figure 8B:
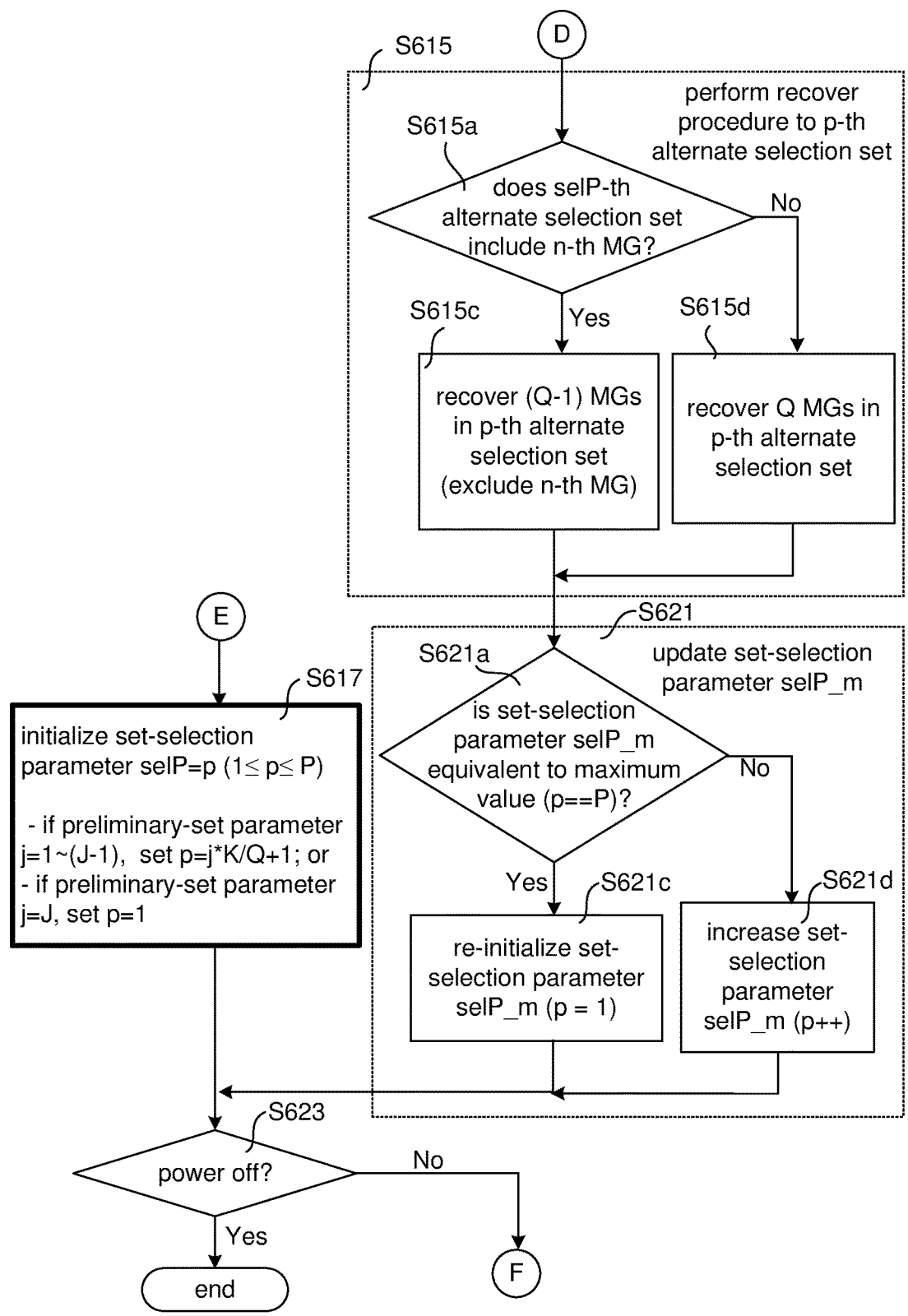

FIGS. 8A and 8B are a flow diagram illustrating the control flow according to the second and the third embodiments of the present disclosure. Many of the steps shown in FIGS. 8A and 8B are similar to those in FIGS. 5A and 5B. For example, steps S401-S411, S415, S421, S423 in FIGS. 5A, 5B are similar to steps S601-S611, S615, S621, S623 in FIGS. 8A and 8B, details about these similar steps are not described for simplifying.

In FIGS. 8A and 8B, the steps executed when the determination result of step S609 is positive are related to the first erase-recover procedure. The steps performed in the first erase-recover procedure after the memory apparatus is power-on in FIGS. 5A and 5B and those in FIGS. 8A and 8B are different.

When the determination result of step S609 is positive, the recovery flag rcvFLG is set as "1" (step S611), and the control circuitry randomly determines the value of the initial-set parameter j (wherein j is a positive integer, and 1≤j≤J). Then, the control circuitry controls the high voltage generator to provide a recover bias voltage to the m-th erase group (EG_m) (step S613).

TABLE 2

| erase-recover procedure performed to m-th erase group (EG_m) | FIG. | memory group undergoing erase (n-th memory group) | alternate selection set being selected for recovery (p) | memory groups in p-th alternate selection set | memory groups being recovered |
|---|---|---|---|---|---|
| $1^{st}$ | FIG. 6A | MG7 (n = 7) | NA | NA | MG1-MG6, (MG7), MG8-MG12 |
| $2^{nd}$ | FIG. 6B | MG4 (n = 4) | p = 2 | MG7-MG12 | MG7-MG12 |
| $3^{rd}$ | FIG. 6C | MG9 (n = 9) | p = 1 | MG1-MG6 | MG1-MG6 |
| $4^{th}$ | FIG. 6D | MG10 (n = 10) | p = 2 | MG7-MG12 | MG1-MG9, (MG10), MG11, MG12 |
| $5^{th}$ | FIG. 6E | MG8 (n = 8) | p = 1 | MG1-MG6 | MG1-MG6 |
| $6^{th}$ | FIG. 6F | MG3 (n = 3) | p = 2 | MG7-MG12 | MG7-MG12 |

Figure 7A:
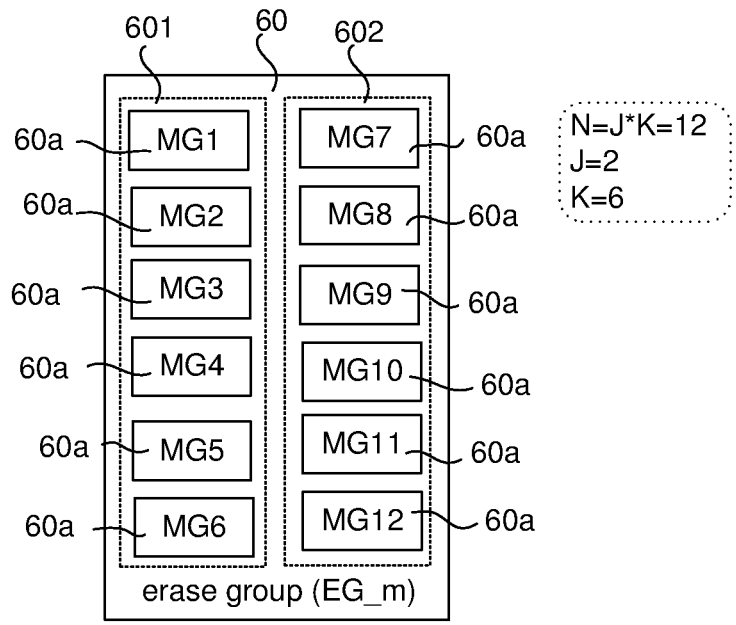
FIG. 7A is a schematic diagram illustrating an example of how memory groups are classified into preliminary recovery sets based on the second and the third embodiments of the present disclosure.

FIG. 7A is a schematic diagram illustrating an example of how memory groups are classified into preliminary recovery sets based on the second and the third embodiments of the present disclosure. The erase groups MG1-MG12 are classified into two preliminary recovery sets (J=2). The first preliminary recovery set (j=1) includes memory groups MG1-MG6, and the second preliminary recovery set (j=2) includes memory groups MG7-MG12.

Figure 7B:
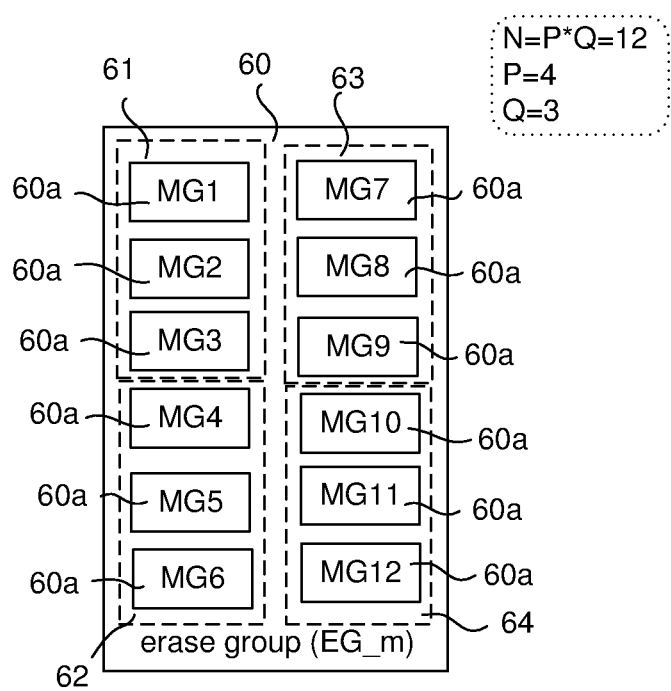
FIG. 7B is a schematic diagram illustrating an example of how memory groups are classified into alternate selection sets based on the second and the third embodiments of the present disclosure.

FIG. 7B is a schematic diagram illustrating an example of how memory groups are classified into alternate selection Step S613 further includes the following steps. The control circuitry determines whether the n-th memory group belongs to the j-th preliminary recovery set (step S613a). If the determination result of step S613a is positive, the K memory groups in the j-th preliminary recovery set other than the n-th memory group are recovered (step S613c). That is, (K−1) memory groups are recovered. Alternatively, in some applications, it is possible to recover all K memory groups in the j-th preliminary recover set in step S613c. That is, the n-th memory group is recovered as well. On the other hand, if the determination result of step S613a is negative, all the K memory groups in the j-th preliminary recovery set are recovered (step S613d).

Later, the set-selection parameter seIP_m is initialized (step S617). The initialized value of the set-selection parameter seIP_m is related to the value of the preliminary-set parameter j. If the preliminary-set parameter is smaller than J, the set-selection parameter seIP_m is initialized as p=j*K/Q+1. If the preliminary-set parameter is equivalent to J, the set-selection parameter seIP_m is initialized as "p=1".

Two embodiments based on the classifications shown in FIGS. 7A, 7B, and the flow diagram shown in FIGS. 8A, 8B are illustrated below. FIGS. 7A, 7B, 8A, 8B, 9A-9F are related to the second embodiment of the present disclosure and FIGS. 7A, 7B, 8A, 8B, 10A-10F are related to the third embodiment of the present disclosure.

FIG. 9A-9F are schematic diagrams illustrating states of memory groups MG1-MG12 in different erase-recover procedures after the memory apparatus is power-on according to the second embodiment of the present disclosure. The left parts of FIGS. 9A-9F represent states of the memory groups (MG1-MG12) in the m-th erase group (EG_m) 60 during the erase operation. The right parts of FIGS. 9A-9F represent states of the N=12 memory groups in the m-th erase group (EG_m) 60 during the recovery operation.

Figure 9A:
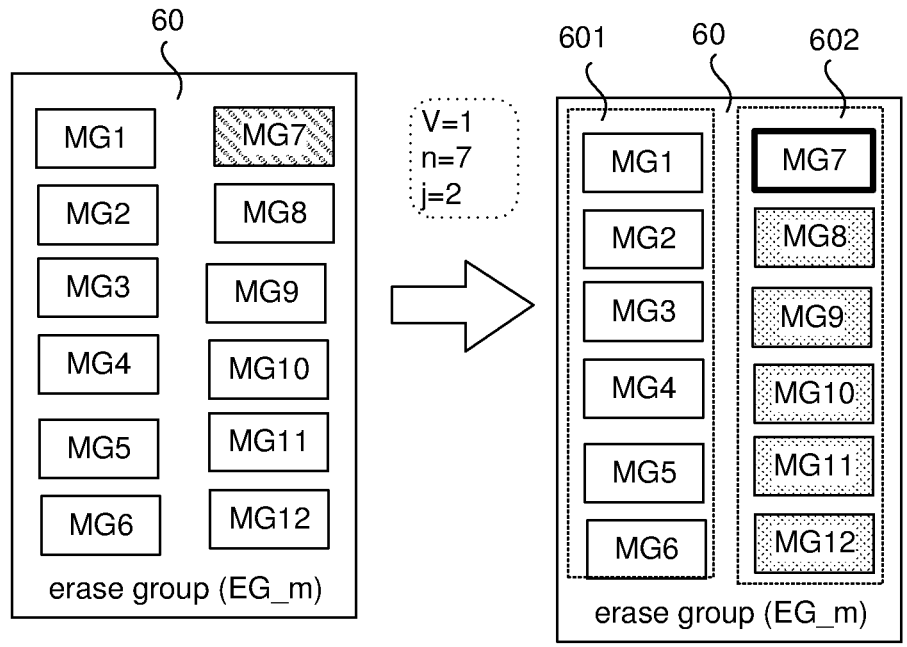
FIG. 9A-9F are schematic diagrams illustrating states of memory groups MG1-MG12 in different erase-recover procedures after the memory apparatus is power-on according to the second embodiment of the present disclosure.

Please refer to FIGS. 8A, 8B, and 9A together. FIG. 9A is corresponding to the $1^{st}$ erase-recover procedure (V=1) performed to the m-th erase group (EG_m) 60 after the memory apparatus is power-on. During the $1^{st}$ erase-recover procedure, the n-th memory group MG7 is erased (n=7, step S607), the recovery flag rcvFLG_m is determined to be equivalent to "0" (step S609), the recovery flag rcvFLG_m is set to "1" (step S611), and the preliminary recovery set 602 (j=2) is randomly selected (for example, j=1) (step S612). As the n-th memory group undergoing erase (that is, memory group MG7) is part of the preliminary recovery set 601 (j=1), only (K−1)=5 memory groups in the preliminary recovery set 602 (j=2) (that is, memory groups MG8-MG12) should be recovered (the determination result of step S613a is positive, and step S613c is performed). In some applications, it is possible to recover all K memory groups in the j-th preliminary recovery set, including the n-th memory group, in step S613c. By the time the recovery operations being performed to the memory groups MG8-MG12 in the preliminary recovery set 602 (j=2) complete, the set-selection parameter seIP_m is initialized as p=1 (step S617).

Figure 9B:
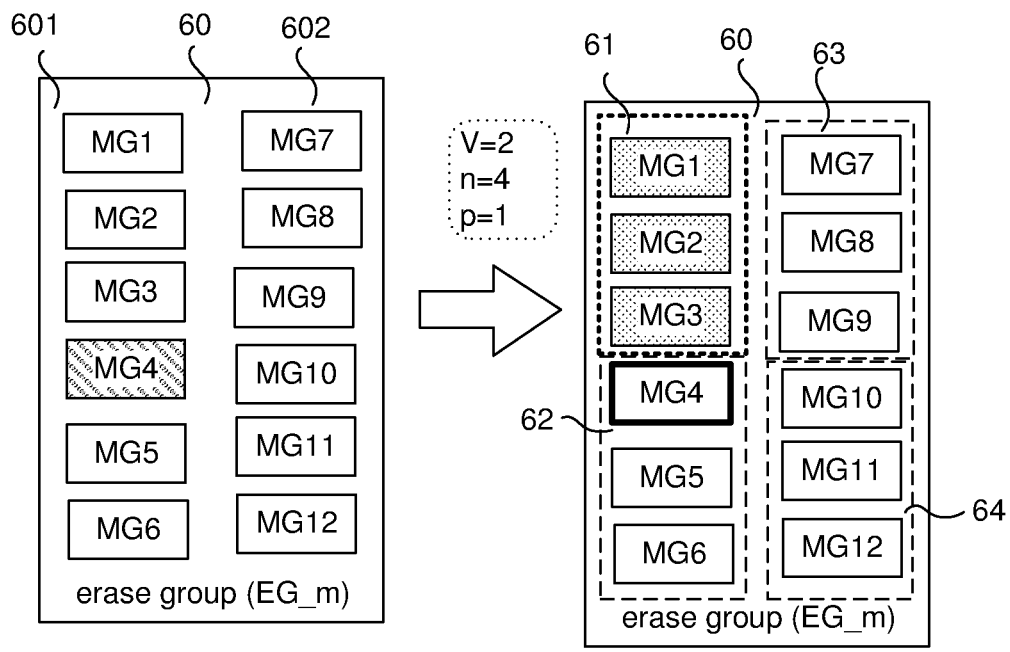

Please refer to FIGS. 8A, 8B, and 9B together. FIG. 9B is corresponding to the $2^{nd}$ erase-recover procedure (V=2) performed to the m-th erase group (EG_m) 60 after the memory apparatus is power-on. During the $2^{nd}$ erase-recover procedure, the n-th memory group MG4 is erased (n=4, step S607), the recovery flag rcvFLG_m is determined to be equivalent to "1" (step S609), and the recovery operation is performed to the memory groups in the alternate selection set 61 (p=1) (step S615). As the n-th memory group undergoing erase (that is, memory group MG4) is not part of the alternate selection set 61 (p=1), all the Q=3 memory groups in the alternate selection set 61 (p=1) (that is, memory groups MG1-MG3) should be recovered (the determination result of step S615a is negative, and step S615d is performed). By the time the recovery operations being performed to the memory groups MG1-MG3 in the alternate selection set 61 (p=1) complete, the set-selection parameter seIP_m is increased by 1 (that is, the set-selection parameter seIP_m is changed from p=1 to p=2) (step S621d).

Figure 9C:
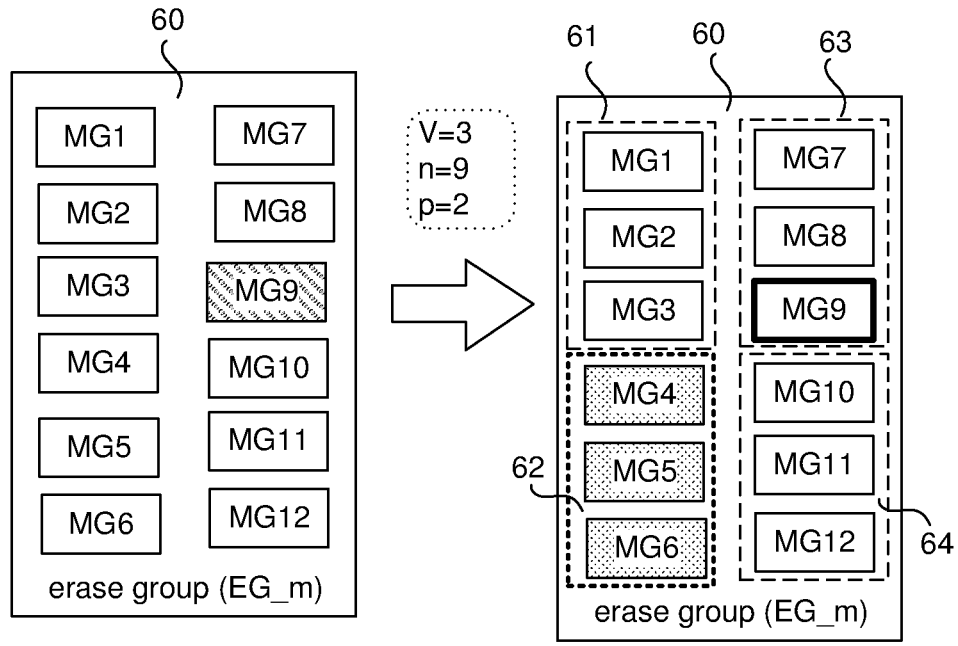

Please refer to FIGS. 8A, 8B, and 9C together. FIG. 9C is corresponding to the $3^{rd}$ erase-recover procedure (V=3) performed to the m-th erase group (EG_m) 60 after the memory apparatus is power-on. During the $3^{rd}$ erase-recover procedure, the n-th memory group MG9 is erased (n=9, step S607), the recovery flag rcvFLG_m is determined to be equivalent to "1" (step S609), and the recovery operation is performed to the memory groups in the alternate selection set 62 (p=2) (step S615). As the n-th memory group undergoing erase (that is, memory group MG9) is not part of the alternate selection set 62 (p=2), all the Q=3 memory groups in the alternate selection set 62 (p=2) (that is, memory groups MG4-MG6) should be recovered (the determination result of step S615a is negative, and step S615d is performed). By the time the recovery operations being performed to the memory groups MG4-MG6 in the alternate selection set 62 (p=2) complete, the set-selection parameter seIP_m is increased by 1 (that is, the set-selection parameter seIP_m is changed from p=2 to p=3) (step S621d).

Figure 9D:
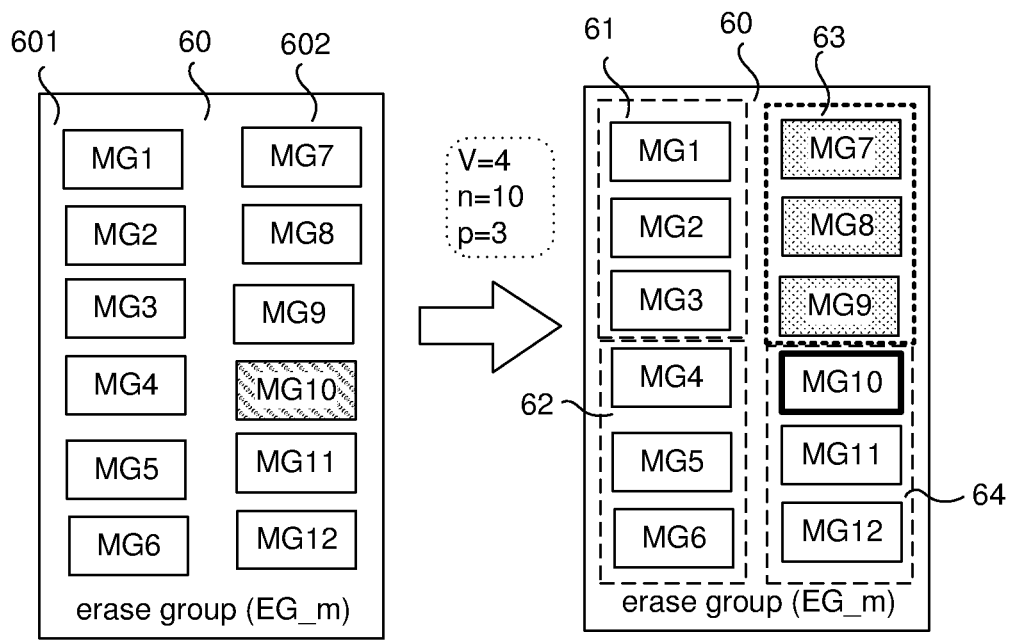

Please refer to FIGS. 8A, 8B, and 9D together. FIG. 9D is corresponding to the $4^{th}$ erase-recover procedure (V=4) performed to the m-th erase group (EG_m) 60 after the memory apparatus is power-on. During the $4^{th}$ erase-recover procedure, the n-th memory group MG10 is erased (n=10, step S607), the recovery flag rcvFLG_m is determined to be equivalent to "1" (step S609), and the recovery operation is performed to the memory groups in the alternate selection set 63 (p=3) (step S615). As the n-th memory group undergoing erase (that is, memory group MG10) is not part of the alternate selection set 63 (p=3), all the Q=3 memory groups in the alternate selection set 63 (p=3) (that is, memory groups MG7-MG9) should be recovered (the determination result of step S615a is negative, and step S615d is performed). By the time the recovery operations being performed to the memory groups MG7-MG9 in the alternate selection set 63 (p=3) complete, the set-selection parameter seIP_m is increased by 1 (that is, the set-selection parameter seIP_m is changed from p=3 to p=4) (step S621d).

Figure 9E:
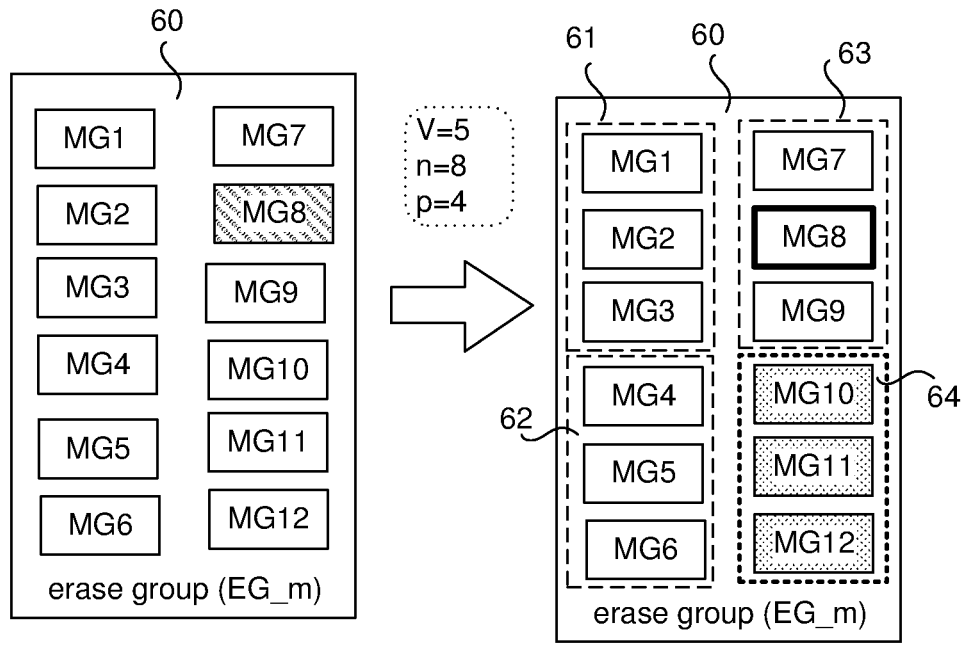

Please refer to FIGS. 8A, 8B, and 9E together. FIG. 9E is corresponding to the 5th erase-recover procedure (V=5) performed to the m-th erase group (EG_m) 60 after the memory apparatus is power-on. During the 5th erase-recover procedure, the n-th memory group MG8 is erased (n=8, step S607), the recovery flag rcvFLG_m is determined to be equivalent to "1" (step S609), and the recovery operation is performed to the memory groups in the alternate selection set 64 (p=4) (step S615). As the n-th memory group undergoing erase (that is, memory group MG8) is not part of the alternate selection set 64 (p=4), all the Q=3 memory groups in the alternate selection set 64 (p=4) (that is, memory groups MG10-MG12) should be recovered (the determination result of step S615a is negative, and step S615d is performed). By the time the recovery operations being performed to the memory groups MG10-MG12 in the alternate selection set 64 (p=4) complete, the set-selection parameter seIP_m is re-initialized (that is, set-selection parameter p is changed from "p=4" to "p=1") (step S621c).

Figure 9F:
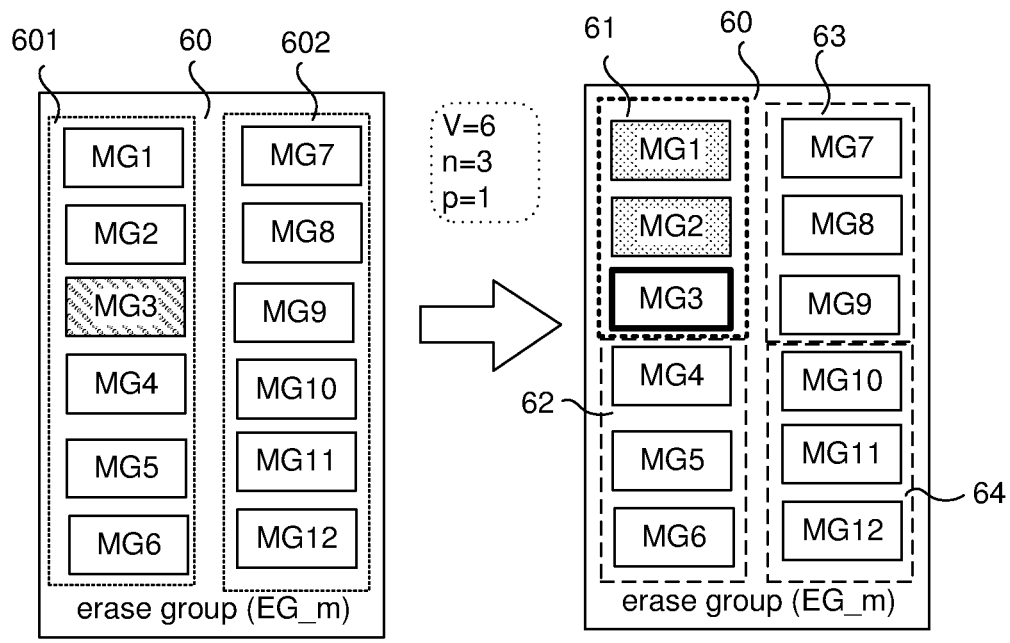

Please refer to FIGS. 8A, 8B, and 9F together. FIG. 9F is corresponding to the 6th erase-recover procedure (V=6) performed to the m-th erase group (EG_m) 60 after the memory apparatus is power-on. During the 6th erase-recover procedure, the n-th memory group MG3 is erased (step S607), the recovery flag rcvFLG_m is determined to be equivalent to "1" (step S609), and the recovery operation is performed to the memory groups in the alternate selection set 61 (p=1) (step S615). As the n-th memory group undergoing erase (that is, memory group MG3) is part of the alternate selection set 61 (p=1), only (Q−1)=2 memory groups in the alternate selection set 61 (p=1) (that is, memory groups MG1, MG2) should be recovered (the determination result of step S615a is positive, and step S615c is performed). In some applications, it is possible to recover all Q memory groups in the p-th alternate selection set, including the n-th memory group, in step S615c.

The erase-recover procedures performed to the m-th erase group (EG_m) 60 based on the second embodiment, according to the present disclosure, are summarized in Table 3.

TABLE 3

| erase-recover procedure performed to m-th erase group (EG_m) | FIG. | memory group undergoing erase (n) | preliminary recovery set/alternate selection set being selected for recovery (j or p) | memory groups in p-th alternate selection set | memory groups being recovered |
|---|---|---|---|---|---|
| $1^{st}$ | FIG. 9A | MG7 (n = 7) | j = 2 | MG7-MG12 | (MG7), MG8-MG12 |
| $2^{nd}$ | FIG. 9B | MG4 (n = 4) | p = 1 | MG1-MG3 | MG1-MG3 |
| $3^{rd}$ | FIG. 9C | MG9 (n = 9) | p = 2 | MG4-MG6 | MG4-MG6 |
| $4^{th}$ | FIG. 9D | MG10 (n = 10) | p = 3 | MG7-MG9 | MG7-MG9 |
| $5^{th}$ | FIG. 9E | MG8 (n = 8) | p = 4 | MG10-MG12 | MG10-MG12 |
| $6^{th}$ | FIG. 9F | MG3 (n = 3) | p = 1 | MG1-MG3 | MG1, MG2, (MG3) |

The sizes of the preliminary recovery sets in the second and the third embodiments are identical and the sizes of the alternate selection sets in the second and the third embodiments are identical. The fundamental difference between these two embodiments is that the selected preliminary recovery sets are different. The selected preliminary recovery set in the second embodiment is the preliminary recovery set 602 (that is, j=2), and the selected preliminary recovery set in the third embodiment is the preliminary recovery set 601 (j=1). Based on such fundamental differences, the selections of the alternate selection sets in the following erase-recover procedures are changed.

FIG. 10A-10F are schematic diagrams illustrating states of memory groups MG1-MG12 in different erase-recover procedures after the memory apparatus is power-on according to the third embodiment of the present disclosure. The left parts of FIGS. 10A-10F represent states of the memory groups (MG1-MG12) in the m-th erase group (EG_m) 60 during the erase operation. The right parts of FIGS. 10A-10F represent states of the memory groups in the m-th erase group (EG_m) 60 during the recovery operation.

Figure 10A:
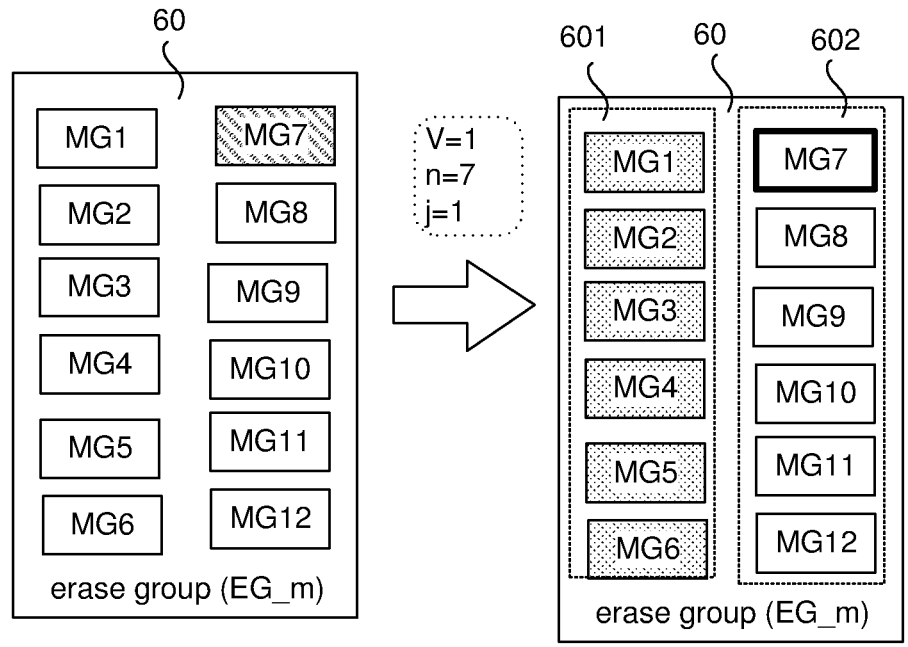
FIG. 10A-10F are schematic diagrams illustrating states of memory groups MG1-MG12 in different erase-recover procedures after the memory apparatus is power-on according to the third embodiment of the present disclosure.

Please refer to FIGS. 8A, 8B, and 10A together. FIG. 10A is corresponding to the $1^{st}$ erase-recover procedure (V=1) performed to the m-th erase group (EG_m) 60 after the memory apparatus is power-on. During the $1^{st}$ erase-recover procedure, the n-th memory group MG7 is erased (n=7, step S607), the recovery flag rcvFLG_m is determined to be equivalent to "0" (step S609), the recovery flag rcvFLG_m is set to "1" (step S611), and the preliminary recovery set 601 (j=1) is randomly selected for recovery (step S615). As the n-th memory group undergoing erase (that is, memory group MG7) is not part of the preliminary recovery set 601 (j=1), all the K=6 memory groups in the preliminary recovery set 601 (that is, memory groups MG1-MG6) should be recovered (the determination result of step S613a is negative, and step S613d is performed). By the time the recovery operations being performed to the memory groups MG1-MG6 in the preliminary recovery set 601 (j=1) complete, the set-selection parameter seIP_m is initialized as p=j*K/Q+1=1*6/3+1=3 (step S617).

Figure 10B:
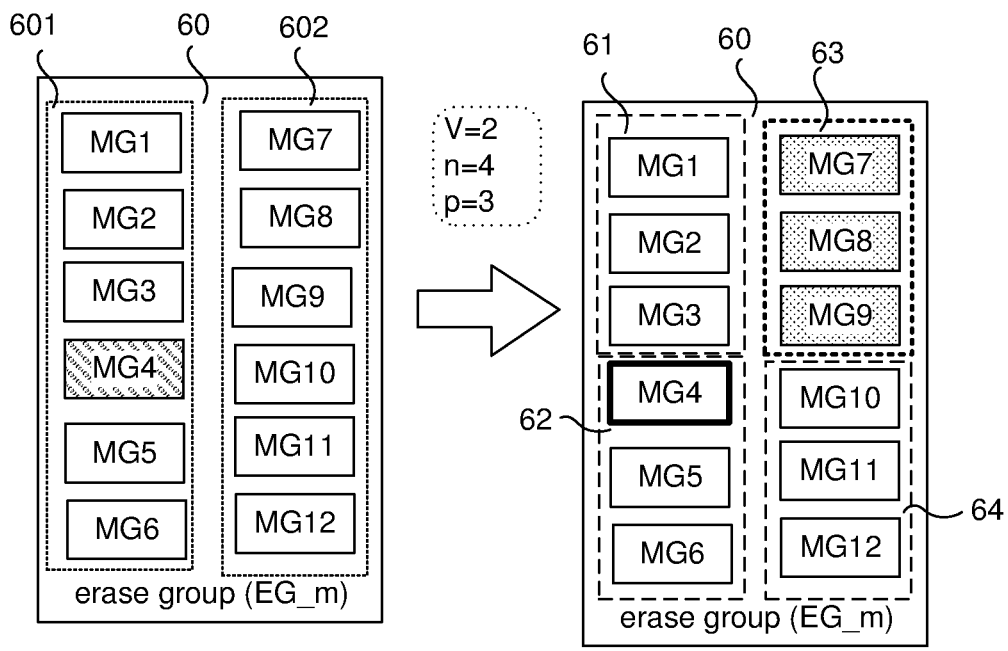

Please refer to FIGS. 8A, 8B, and 10B together. FIG. 10B is corresponding to the $2^{nd}$ erase-recover procedure (V=2) performed to the m-th erase group (EG_m) 60 after the memory apparatus is power-on. During the $2^{nd}$ erase-recover procedure, the n-th memory group MG4 is erased (n=4, step S607), the recovery flag rcvFLG_m is determined to be equivalent to "1" (step S609), and the recovery operation is performed to the memory groups in the alternate selection set 63 (p=3) (step S615). As the n-th memory group undergoing erase (that is, memory group MG4) is not part of the alternate selection set 63, all the Q=3 memory groups in the alternate selection set 63 (that is, memory groups MG7-MG9) should be recovered (the determination result of step S615a is negative, and step S615d is performed). By the time the recovery operations being performed to the memory groups MG7-MG9 in the alternate selection set 63 complete, the set-selection parameter seIP_m increased by 1 (that is, the set-selection parameter seIP_m is changed from p=3 to p=4) (step S621d).

Please refer to FIGS. 8A, 8B, and 10O together. FIG. 10O is corresponding to the $3^{rd}$ erase-recover procedure (V=3) performed to the m-th erase group (EG_m) 60 after the memory apparatus is power-on. During the $3^{rd}$ erase-recover procedure, the n-th memory group MG9 is erased (n=9, step S607), the recovery flag rcvFLG_m is determined to be equivalent to "1" (step S609), and the recovery operation is performed to the memory groups in the alternate selection set 64 (p=4) (step S615). As the n-th memory group undergoing erase (that is, memory group MG9) is not part of the alternate selection set 61, all the Q=3 memory groups in the alternate selection set 64 (that is, memory groups MG10-MG12) should be recovered (the determination result of step S615a is negative, and step S615d is performed). By the time the recovery operations being performed to the memory groups MG10-MG12 in the alternate selection set 64 complete, the set-selection parameter seIP_m is re-initialized (that is, the set-selection parameter seIP_m is changed from p=4 to p=1) (step S621c).

Figure 10C:
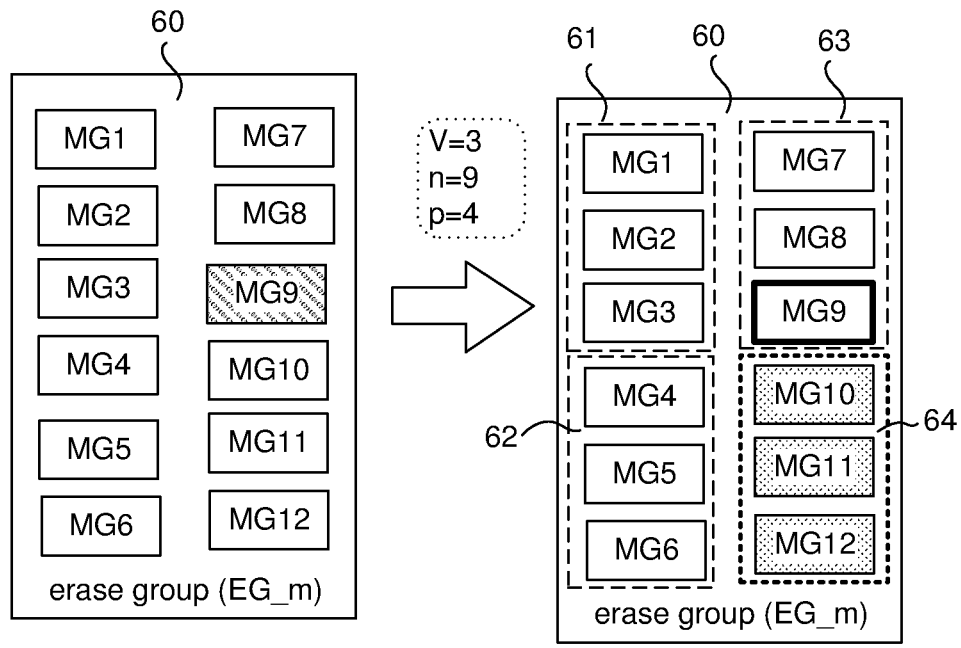
Figure 10D:
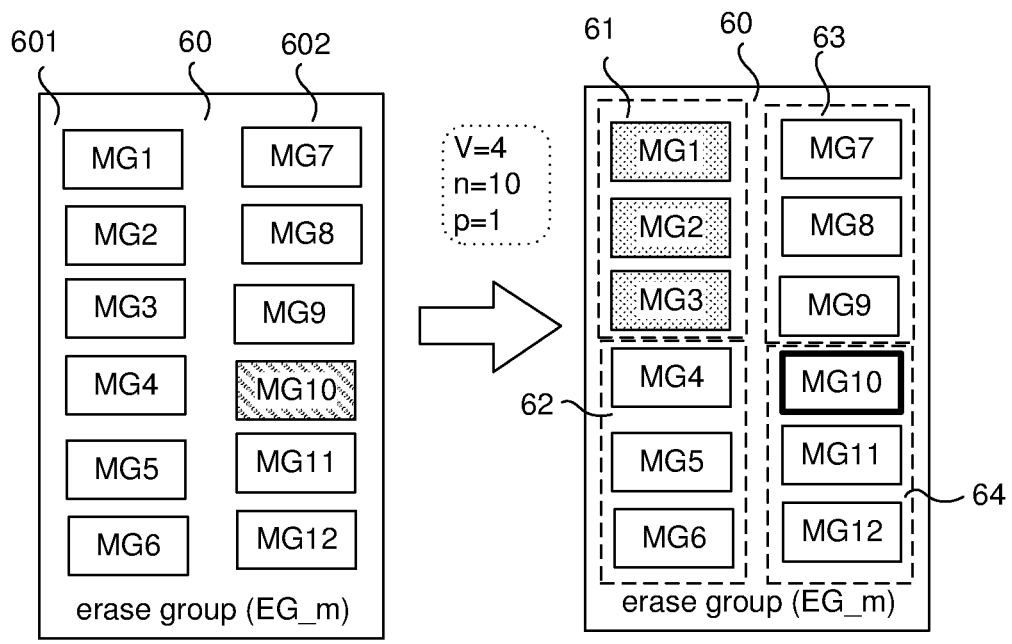

Please refer to FIGS. 8A, 8B, and 10D together. FIG. 10D is corresponding to the 4th erase-recover procedure (V=4) performed to the m-th erase group (EG_m) 60 after the memory apparatus is power-on. During the 4th erase-recover procedure, the n-th memory group MG10 is erased (n=10, step S607), the recovery flag rcvFLG_m is determined to be equivalent to "1" (step S609), and the recovery operation is performed to the memory groups in the alternate selection set 61 (p=1) (step S615). As the n-th memory group undergoing erase (that is, memory group MG10) is not part of the alternate selection set 61, all the Q=3 memory groups in the alternate selection set 61 (that is, memory groups MG1-MG3) should be recovered (the determination result of step S615a is negative, and step S615d is performed). By the time the recovery operations being performed to the memory groups MG1-MG3 in the alternate selection set 61 are complete, the set-selection parameter seIP_m is increased by 1 (that is, the set-selection parameter seIP_m is changed from p=1 to p=2) (step S621d).

Figure 10E:
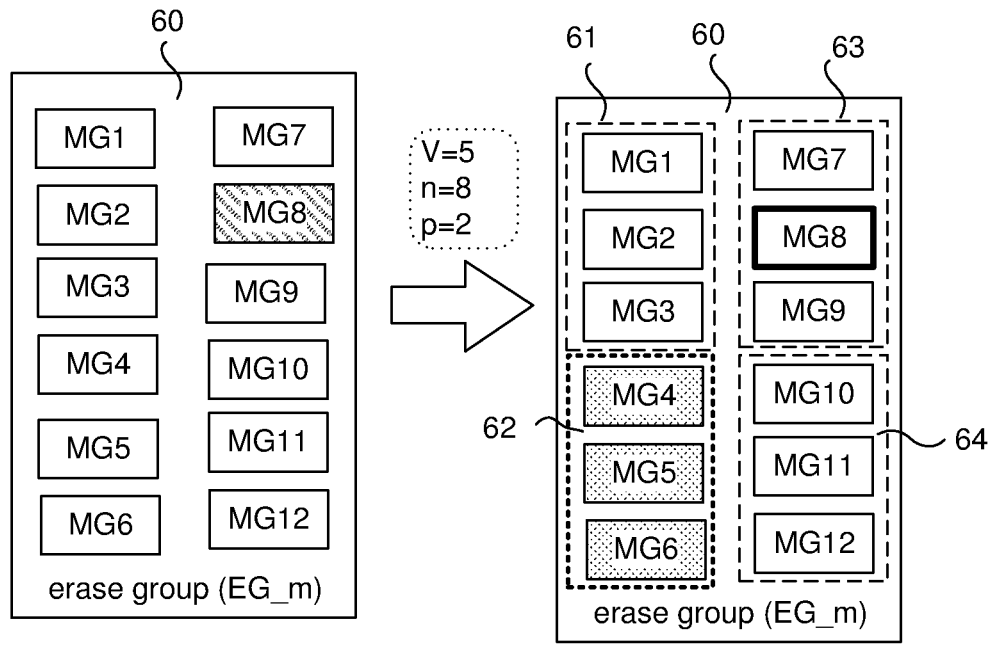

Please refer to FIGS. 8A, 8B, and 10E together. FIG. 10E is corresponding to the 5$^{th}$ erase-recover procedure (V=5) performed to the m-th erase group (EG_m) 60 after the memory apparatus is power-on. During the 5th erase-recover procedure, the n-th memory group MG8 is erased (n=8, step S607), the recovery flag rcvFLG_m is determined to be equivalent to "1" (step S609), and the recovery operation is performed to the memory groups in the alternate selection set 62 (p=2) (step S615). As the n-th memory group undergoing erase (that is, memory group MG8) is not part of the alternate selection set 62, all the Q=3 memory groups in the alternate selection set 62 (that is, memory groups MG4-MG6) should be recovered (the determination result of step S615a is negative, and step S615d is performed). By the time the recovery operations being performed to the memory groups MG4-MG6 in the alternate selection set 62 complete, the set-selection parameter seIP_m is increased by 1 (that is, set-selection parameter seIP_m is changed from p=2 to p=3) (step S621d).

Figure 10F:
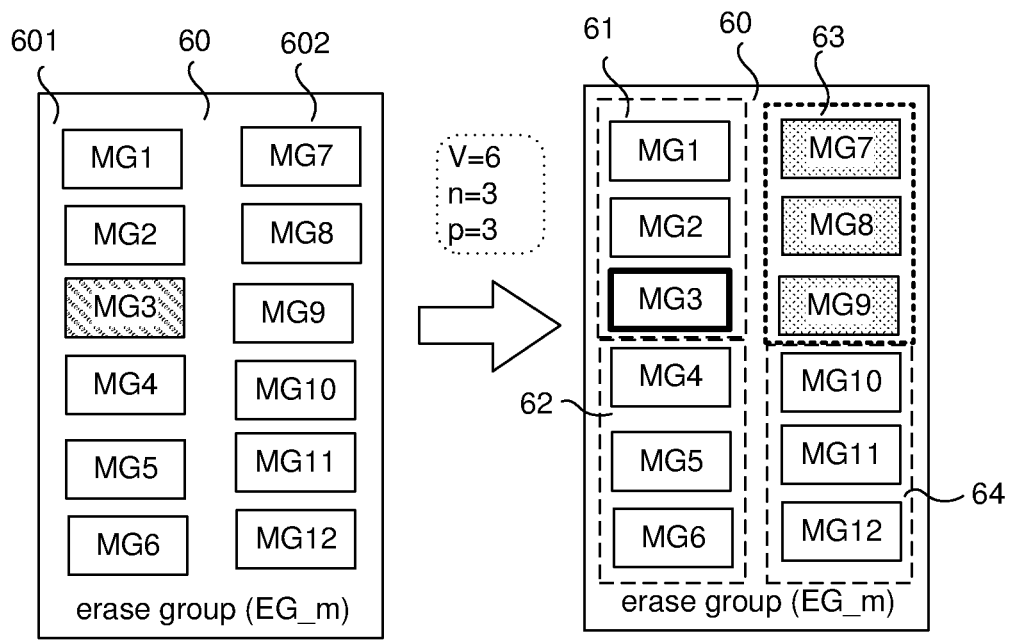

Please refer to FIGS. 8A, 8B, and 10F together. FIG. 10F is corresponding to the 6th erase-recover procedure (V=6) performed to the m-th erase group (EG_m) 60 after the memory apparatus is power-on. During the 6th erase-recover procedure, the n-th memory group MG3 is erased (step S607), the recovery flag rcvFLG_m is determined to be equivalent to "1" (step S609), and the recovery operation is performed to the Q memory groups in the alternate selection set 63 (p=3) (step S615). As the n-th memory group undergoing erase (that is, memory group MG3) is not part of the alternate selection set 62, all the Q=3 memory groups in the alternate selection set 62 (that is, memory groups MG4-MG6) should be recovered (the determination result of step S615a is negative, and step S615d is performed).

The erase-recover procedures performed to the m-th erase group (EG_m) 60 based on the third embodiment according to the present disclosure are summarized in Table 4.

TABLE 4

| erase-recover procedure performed to m-th erase group (EG_m) | FIG. | memory group undergoing erase (n) | preliminary recovery set/alternate selection set being selected for recovery (j or p) | memory groups in p-th alternate selection set | memory groups being recovered |
|---|---|---|---|---|---|
| 1$^{st}$ | FIG. 10A | MG7 (n = 7) | j = 1 | MG1-MG6 | MG1-MG6 |
| 2$^{nd}$ | FIG. 10B | MG4 (n = 4) | p = 3 | MG7-MG9 | MG7-MG9 |
| 3$^{rd}$ | FIG. 10C | MG9 (n = 9) | p = 4 | MG10-MG12 | MG10-MG12 |
| 4$^{th}$ | FIG. 10D | MG10 (n = 10) | p = 1 | MG1-MG3 | MG1-MG3 |
| 5$^{th}$ | FIG. 10E | MG8 (n = 8) | p = 2 | MG4-MG6 | MG4-MG6 |
| 6$^{th}$ | FIG. 10F | MG3 (n = 3) | p = 3 | MG7-MG9 | MG7-MG9 |

Please refer to the second and the third embodiments together. Although the classification and the definitions of the preliminary recovery sets and the alternate selection sets in the second and the third embodiments are the same, how the erase-recover procedures proceed are different in these embodiments. As the selected preliminary recovery sets for recovery in the second and the third embodiments are different, the memory groups being recovered in the following erase-recover procedures in the second and the third embodiments are different.

Moreover, the set-selection parameter seIP_m can be initialized to different values. In the second embodiment, the initial-set parameter j is assumed to be 2 (j=J), so the set-selection parameter seIP_m is initialized as "p=1". In the third embodiment, the initial-set parameter j is assumed to be 1 (j<J), so the set-selection parameter seIP_m is initialized as p=j*K/Q+1 (for example, p=3). In other words, the randomly selected preliminary recovery set dominates which of the alternate selection sets 61, 62, 63, 64 will be firstly selected for the recovery operation in the second erase-recover procedure.

According to the present disclosure, the erase group can be defined with two types of sets, the preliminary recovery sets, and the alternate selection sets. In the first erase-recover procedure, the memory groups in the erase group are selected/unselected for the erase operation, based on which of the preliminary recovery sets they belong to. In other erase-recover procedures, the memory groups in the erase group are selected/unselected for the erase operation based on which of the alternate selection sets they belong to.

In the specification, the variable J represents the number of the preliminary recovery sets being defined, and the variable K represents the number of memory groups in each of the preliminary recovery sets. The variable P represents the number of the alternate selection sets being defined, and the variable Q represents the number of memory groups in each of the alternate selection sets. The variables M, N, J, K, P, Q are positive integers, and these variables have the following relationships, N=J*K and N=P*Q. Accordingly, N is multiples of J, K, P, and Q.

Please note that although the above illustrations do not specifically mention the preliminary recovery set in the first embodiment, the first embodiment can be considered the case that J=1 and K=12. That is, the whole m-th erase group (EG_m) can be considered as the only preliminary recovery set in the first embodiment.

According to the present disclosure, the variable K is multiple of the variable Q, and the variable P is multiple of the variable J. Therefore, the number of the memory groups included in the preliminary recovery set (K) is higher than the number of the memory groups included in the alternate selection set (Q). Moreover, the size of the preliminary recovery set is greater than the size of the alternate selection set.

The values of the variables (N, J, K, P, Q) in the embodiments mentioned above are examples, and other possible values might be selected. For the erase group with N=12 memory groups, the combinations of the variables J, K, P, Q shown in Table 5 might be adopted.

TABLE 5

| number of preliminary recovery sets (J) & number of memory groups in each preliminary recovery set (K) | number of alternate selection sets (P) & number of memory groups in each alternate selection set (Q) |
|---|---|
| J = 1, K = 12 | P = 2, Q = 6 |
|  | P = 3, Q = 4 |
|  | P = 4, Q = 3 |
|  | P = 6, Q = 2 |
| J = 2, K = 6 | P = 4, Q = 3 |
|  | P = 6, Q = 2 |
| J = 3, K = 4 | P = 6, Q = 2 |

In the specification, how the memory groups are selected for recovery in the first erase-recover procedure after power-on of the memory apparatus is different from how the memory groups are selected for recovery in other erase-recover procedures after power-on of the memory apparatus. In both embodiments, the number of the memory groups being recovered in the first erase-recover procedure after power-on of the memory apparatus is higher than the number of the memory groups being recovered in other erase-recover procedures after power-on of the memory apparatus. Moreover, the alternate selection sets in the erase group are selected separately and recursively for performing the regional recovery operation.

When the alternate selection set being selected for recovery includes the n-th memory group undergoing erase, the memory groups in the selected alternate selection set being recovered, may include or exclude the n-th memory group undergoing erase, depending on the design of the applications. Alternatively speaking, Q or (Q−1) memory groups are recovered when the memory groups in the selected alternate selection set include the n-th memory group. On the other hand, when the alternate selection set being selected for performing the local recovery operation excludes the n-th memory group undergoing erase, all the Q memory groups in the selected alternate selection set are recovered.

Figure 11:
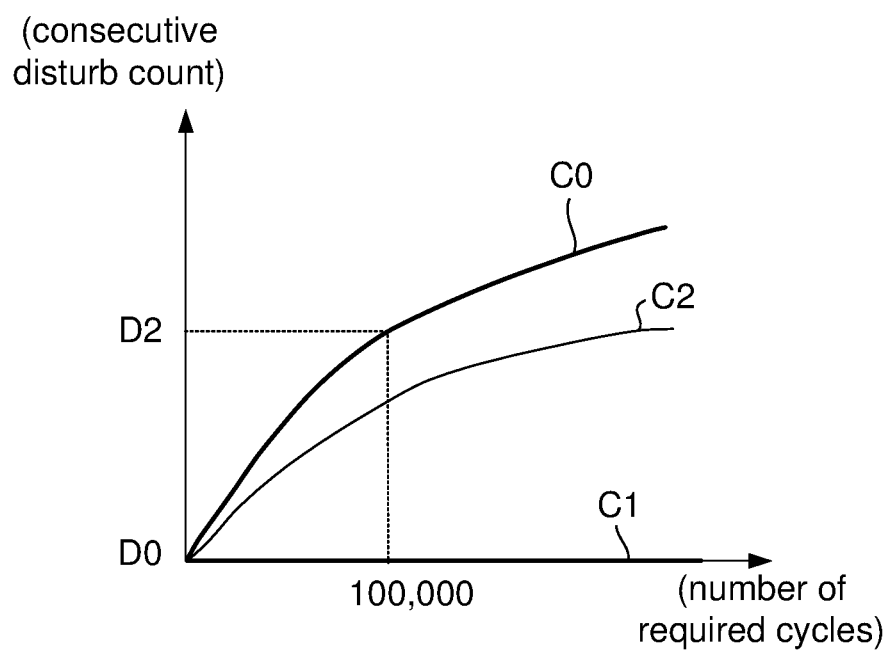
FIG. 11 is a schematic diagram comparing the recovery effects of the conventional design, the first embodiment, and the second and the third embodiments.

FIG. 11 is a schematic diagram comparing the recovery effects of the conventional design, the first embodiment, and the second and the third embodiments. The vertical axis represents the consecutive disturb count, and the horizontal axis represents the number of required write/erase/power-down cycles of a memory group. Curve C0 is corresponding to the conventional approach in U.S. Pat. No. 8,982,640, curve C1 is corresponding to the first embodiment, and curve C2 is corresponding to the second and the third embodiments. The more cycles are required, the more probability to have a high consecutive disturb count. Consequently, a larger preliminary recovery set is required.

In the case that the memory apparatus has operated for 100,000 cycles, the curve C0 shows that the memory group, according to the conventional approach, might be disturbed up to D0 times without being recovered. Under the same circumstance, the curve C1 shows that all the memory groups are recovered according to the first embodiment, and the curve C2 shows that the memory group according to the second and the third embodiments. The curve C1 shows that the memory group according to the first embodiment do not suffer consecutive disturbance (just one-time disturbance) without being recovered, while curve C2 shows that the memory group according to the second/third embodiments have less suffering (D0<D2) of consecutive disturbance without being recovered.

The present disclosure proposes a control method capable of equally select memory groups for recovery. The embodiments based on the present disclosure can reduce the chance that a memory group not being selected for recovery after power-on based on the conventional approach. For example, the chance that a memory group not being selected for recovery after power-on based on the conventional approach, the first embodiment, and the second and the third embodiments are 3/4, 0, and 1/2, respectively. The control method can be adopted to memory apparatus using NAND flash or NOR flash.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory apparatus, comprising:
   a non-volatile memory array, comprising:
   a first erase group, comprising a plurality of memory groups jointly sharing a first well, wherein the memory groups in the first erase group are classified into a plurality of alternate selection sets,
   wherein a first memory group among the memory groups is erased according to a first erase command after the memory apparatus is power-on,
   a first amount of the memory groups are recovered in a first erase-recover procedure after the first memory group is erased,
   a second memory group among the memory groups is erased according to a second erase command after the first erase-recover procedure,
   a second amount of the memory groups in a first alternate selection set among the plurality of alternate selection sets are recovered in a second erase-recover procedure after the second memory group is erased,
   a third memory group among the memory groups is erased according to a third erase command after the second erase-recover procedure, and
   the memory groups in a second alternate selection set among the plurality of alternate selection sets are recovered in a third erase-recover procedure after the third memory group is erased,
   wherein the first amount is greater than the second amount, and the memory groups in the second alternate selection set are different from the memory groups in the first alternate selection set.

2. The memory apparatus according to claim 1, wherein in the first erase-recover procedure, all the memory groups in the first erase group are recovered; or the memory groups in the first erase group, excluding the first memory group, are recovered.

3. The memory apparatus according to claim 1, wherein when the first alternate selection set includes the second memory group,
all the memory groups in the first alternate selection set are recovered in the second erase-recover procedure, or
the memory groups in the first alternate selection set, excluding the second memory group, are recovered in the second erase-recover procedure.

4. The memory apparatus according to claim 1, wherein when the first alternate selection set excludes the second memory group,
all the memory groups in the first alternate selection set are recovered in the second erase-recover procedure.

5. The memory apparatus according to claim 1, wherein the memory groups in the first erase group are classified into a plurality of preliminary recovery sets in the first erase-recover procedure, and a first preliminary recovery set among the plurality of preliminary recovery sets is selected for recovery in the first erase-recover procedure.

6. The memory apparatus according to claim 5, wherein when the first preliminary recovery set includes the first memory group,
all the memory groups in the first preliminary recovery set are recovered in the first erase-recover procedure, or
the memory groups in the first preliminary recovery set, excluding the first memory group, are recovered in the first erase-recover procedure.

7. The memory apparatus according to claim 5, wherein when the first preliminary recovery set excludes the first memory group,
all the memory groups in the first preliminary recovery set are recovered in the first erase-recover procedure.

8. The memory apparatus according to claim 5, wherein the first preliminary recovery set is determined by a predefined value or a randomly generated value.

9. The memory apparatus according to claim 5, wherein the memory groups in the first alternate selection set are different from the memory groups in the first preliminary recovery set.

10. The memory apparatus according to claim 1, wherein the non-volatile memory array further comprises: a second erase group, comprising a plurality of memory groups jointly sharing a second well, wherein the plurality of memory groups in the second erase group are not recovered in the first erase-recover procedure nor recovered in the second erase-recover procedure.

11. The memory apparatus according to claim 1, further comprising:
a control circuitry, coupled to a host and the non-volatile memory array, wherein the control circuitry receives the first erase command and the second erase command from the host, and conducts the first erase-recover procedure and the second erase-recover procedure; and
a high voltage generator, coupled to the control circuitry and the non-volatile memory array, wherein the control circuitry controls the high voltage generator to provide an erase bias voltage to the first memory group according to the first erase command, and provide the erase bias voltage to the second memory according to the second erase command.

12. A control method applied to a non-volatile memory array comprising a plurality of erase groups, wherein a first erase group among the plurality of erase groups comprises a plurality of memory groups, wherein the plurality of memory groups jointly share a first well, and the control method comprises steps of:
erasing a first memory group among the memory groups according to a first erase command after the memory apparatus is power-on;
recovering a first amount of the memory groups in a first erase-recover procedure after the first memory group is erased;
erasing a second memory group among the memory groups according to a second erase command after the first erase-recover procedure; and
recovering a second amount of the memory groups in a second erase-recover procedure after the second memory group is erased, wherein the first amount is greater than the second amount.

13. The control method according to claim 12, wherein in the first erase-recover procedure, the control method further comprises a step of: recovering all the memory groups in the first erase group; or recovering the memory groups in the first erase group, excluding the first memory group.

14. The control method according to claim 12, wherein the memory groups in the first erase group are classified into a plurality of preliminary recovery sets in the first erase-recover procedure, and a first preliminary recovery set among the plurality of preliminary recovery sets is selected for recovery in the first erase-recover procedure.

15. The control method according to claim 14, wherein in the first erase-recover procedure, the control method further comprises a step of:
when the first preliminary recovery set includes the first memory group, recovering all the memory groups in the first preliminary recovery set, or recovering the memory groups in the first preliminary recovery set, excluding the first memory group; or
when the first preliminary recovery set excludes the first memory group, recovering all the memory groups in the first preliminary recovery set.

* * * * *